(12) United States Patent
Yun et al.

(10) Patent No.: US 8,755,224 B2
(45) Date of Patent: Jun. 17, 2014

(54) NON-VOLATILE MEMORY DEVICE AND RELATED READ METHOD

(75) Inventors: Eun-jin Yun, Seoul (KR); Sang-chul Kang, Hwaseong-si (KR); Seung-jae Lee, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 217 days.

(21) Appl. No.: 13/358,534

(22) Filed: Jan. 26, 2012

(65) Prior Publication Data

US 2012/0213003 A1 Aug. 23, 2012

(30) Foreign Application Priority Data

Feb. 17, 2011 (KR) .................. 10-2011-0014142

(51) Int. Cl.
*G11C 11/34* (2006.01)
(52) U.S. Cl.
USPC ............ 365/185.03; 365/185.09; 365/185.12; 365/185.17; 365/185.18; 365/185.24; 365/185.25; 365/185.33
(58) Field of Classification Search
USPC ............. 365/185.03, 185.09, 185.12, 185.17, 365/185.18, 185.24, 185.25, 185.33
See application file for complete search history.

(56) References Cited

U.S. PATENT DOCUMENTS 7,372,767 B2 * 5/2008 Kim .................... 365/185.17
7,773,422 B2 * 8/2010 Park et al. ............. 365/185.03

FOREIGN PATENT DOCUMENTS

| JP | 2007-068002 | 3/2007 |
| KR | 1020100054485 A | 5/2010 |
| KR | 1020100091413 A | 8/2010 |

* cited by examiner

*Primary Examiner* — Trong Phan
(74) *Attorney, Agent, or Firm* — Volentine & Whitt, PLLC

(57) ABSTRACT

A nonvolatile memory device comprises a memory cell array, a page buffer, and a bit line connection signal controller. The memory cell array comprises a plurality of word lines and bit lines arranged in rows and columns, and a plurality of memory cells connected to the respective word lines and bit lines. The page buffer connects a selected bit line among the plurality of bit lines to the page buffer, applies a precharge voltage to the selected bit line, and senses a voltage of the selected bit line after developing of the selected bit line according to a bit line connection signal, during a read operation. The bit line connection signal controller changes the bit line connection signal according to a control signal, during the read operation.

20 Claims, 16 Drawing Sheets

NON-VOLATILE MEMORY DEVICE AND RELATED READ METHOD

CROSS-REFERENCE TO RELATED APPLICATIONS

This application claims priority under 35 U.S.C. §119 to Korean Patent Application No. 10-2011-0014142 filed on Feb. 17, 2011the disclosure of which is hereby incorporated by reference in its entirety.

BACKGROUND OF THE INVENTION

Embodiments of the inventive concept relate generally to electronic memory technologies. More particularly, embodiments of the inventive concept relate to nonvolatile memory devices and related read methods.

Nonvolatile memory devices have been adopted for long-term data storage in a wide variety of technologies, such as mobile phones, digital cameras, personal digital assistants (PDAs), mobile computers, desktop computers, and various others.

One popular type of nonvolatile memory device is a flash memory device. In a flash memory device, data is stored in a cell transistor by modifying its threshold voltage. For example, in a single-level cell flash memory device, a bit of data is stored in a cell transistor by modifying its threshold voltage between an erased state and a programmed state.

In general, the threshold voltage of a flash cell transistor is determined by a number of electrons stored in a floating gate of the flash cell transistor. As more electrons are stored in the floating gate, the threshold voltage of the cell transistor increases. Unfortunately, the floating gate of a cell transistor can lose stored electrons over time, which can lower the cell transistor's threshold voltage. As the floating gate loses stored electrons, the reliability of the cell transistor tends to decrease.

SUMMARY OF THE INVENTION

According to one embodiment of the inventive concept, a nonvolatile memory device comprises a memory cell array, a page buffer, and a bit line connection signal controller. The memory cell array comprises a plurality of word lines and bit lines arranged in rows and columns, and a plurality of memory cells connected to the respective word lines and bit lines. The page buffer that connects a selected bit line among the plurality of bit lines to the page buffer, applies a precharge voltage to the selected bit line, and senses a voltage of the selected bit line after developing of the selected bit line according to a bit line connection signal, during a read operation. The bit line connection signal controller that changes the bit line connection signal according to a control signal, during the read operation.

According to another embodiment of the inventive concept, a method of performing a read operation in a nonvolatile memory device comprises applying a precharge voltage to a bit line selected according to a bit line connection signal, sensing a voltage of the selected bit line after the selected bit line is developed, and changing a voltage of the bit line connection signal according to a control signal.

According to another embodiment of the inventive concept, a method of performing a read operation in a nonvolatile memory device, comprising, reading data from selected memory cells of the nonvolatile memory device, determining whether the data contains at least one error that cannot be corrected by an error correction circuit, and upon determining that the data contains at least one error that cannot be corrected by an error correction circuit, adjusting a bit line connection signal that controls a connection between a bit line connected to one of the selected memory cells and a page buffer connected to the bit line to compensate for a reduction or an increase in a threshold voltage of the selected memory cell.

These and other embodiments of the inventive concept can be used to improve the reliability of read operations performed in nonvolatile memory devices by adjusting for changes in the threshold voltages of programmed memory cells.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

The terminology used herein is for the purpose of describing particular embodiments only and is not intended to be limiting of the invention. As used herein, the singular forms "a", "an" and "the" are intended to encompass the plural forms as well, unless the context clearly indicates otherwise. Terms such as "include", "have", and "comprise", where used in this specification, indicate the presence of stated features, but they do not preclude the presence or addition of one or more other features.

Unless otherwise defined, all terms (including technical and scientific terms) used herein have the same meaning as commonly understood by one of ordinary skill in the art. Terms such as those defined in common dictionaries should be interpreted as having a meaning that is consistent with their meaning in the context of the relevant art and will not be interpreted in an idealized or overly formal sense unless expressly so defined herein.

Figure 1:
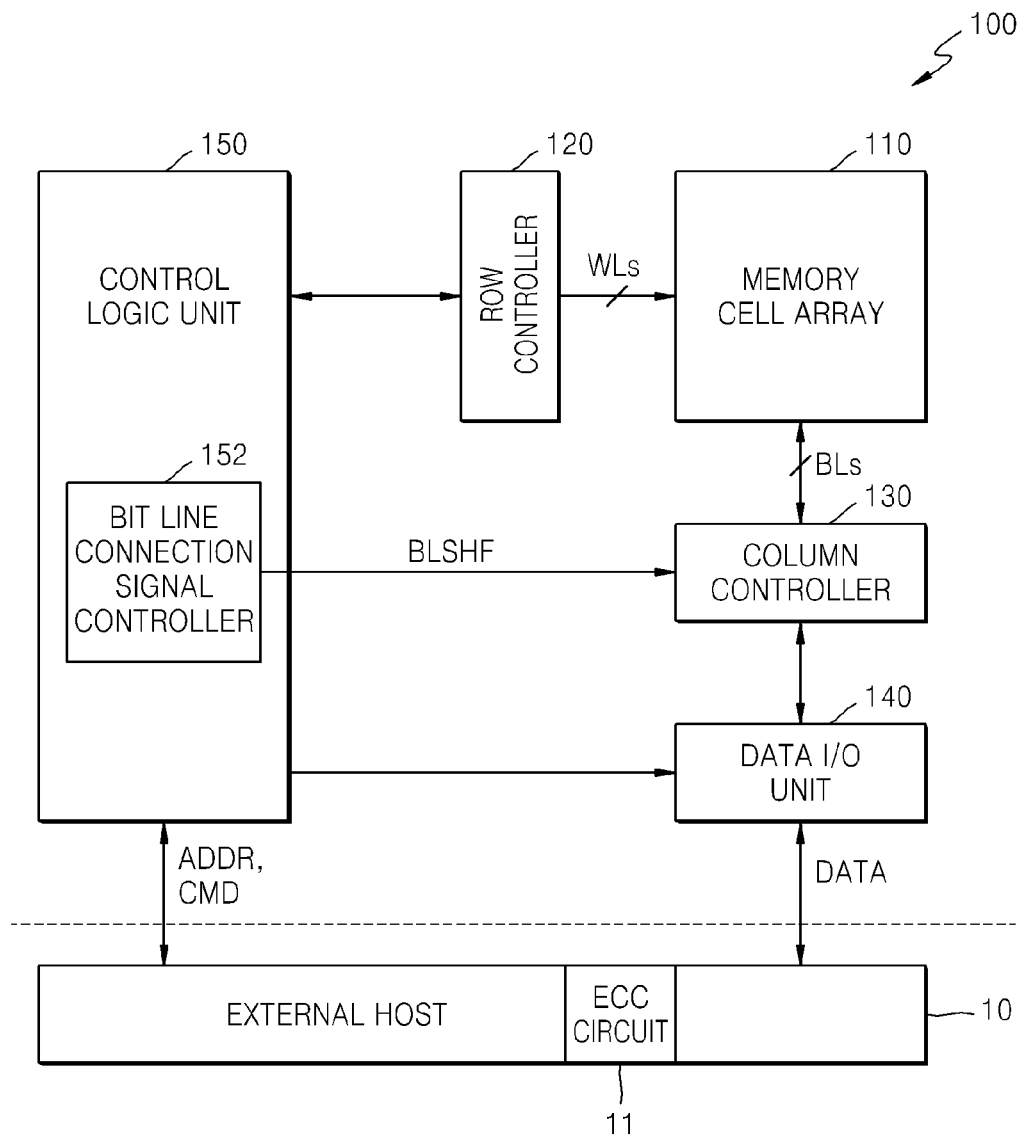
FIG. 1 is a block diagram of a nonvolatile memory device according to an embodiment of the inventive concept.

FIG. 1 is a block diagram of a nonvolatile memory device 100 according to an embodiment of the inventive concept.

Referring to FIG. 1, nonvolatile memory device 100 comprises a memory cell array 110, a row controller 120, a column controller 130, a data input/output (I/O) unit 140, and a control logic unit 150.

Row controller 120 is connected to word lines WLs of memory cell array 110, and it selects one of word lines WLs and applies a voltage to the selected word line to perform a program operation, a read operation, or an erase operation.

Column controller 130 is connected to bit lines BLs of memory cell array 110. In a read operation, column controller 130 reads data from a selected memory cell of memory cell array 110. In a program operation, column controller 130 determines a state of the selected memory cell and writes data to the selected memory cell by applying a write control voltage thereto via a corresponding bit line among bit lines BLs. Column controller 130 typically comprises a plurality of read/write circuits connected to corresponding bit lines, as will be described below. Each of the read/write circuits can comprise, for instance, a page buffer or a sense amplifier.

Row controller 120 comprises an address decoder (not shown) for selecting a word line corresponding to a target address, and column controller 130 comprises an address decoder (not shown) for selecting a bit line corresponding to the target address. Each of the address decoders receives an address ADDR from an external host 10. The address decoder of row controller 120 selects the corresponding word line by decoding a row address included in address ADDR. The address decoder of column controller 130 selects the corresponding bit line by decoding a column address included in address ADDR.

Data I/O unit 140 operates under the control of control logic unit 150, and it exchanges data DATA with external host 10. Data I/O unit 140 transmits data DATA received from external host 10 to the page buffer of each of the read/write circuits included in column controller 130. Also, data I/O unit 140 transmits data DATA received from column controller 130 to external host 10. Data I/O unit 140 typically comprises a data buffer (not shown). Where an error occurs during the read operation of nonvolatile memory device 100, external host 10 can correct the error using an error correcting code (ECC) circuit 11.

Control logic unit 150 controls the program operation or the read operation according to a command CMD and address ADDR received from external host 10. Control logic unit 150 comprises a bit line connection signal controller 152 that changes a bit line connection signal BLSHF during the read operation. Bit line connection signal BLSHF controls a connection between a bit line and the page buffer of column controller 130. Bit line connection signal controller 152 changes a voltage and/or a developing time period of bit line connection signal BLSHF to compensate for a reduction or an increase in a threshold voltage of a memory cell.

Figure 2:
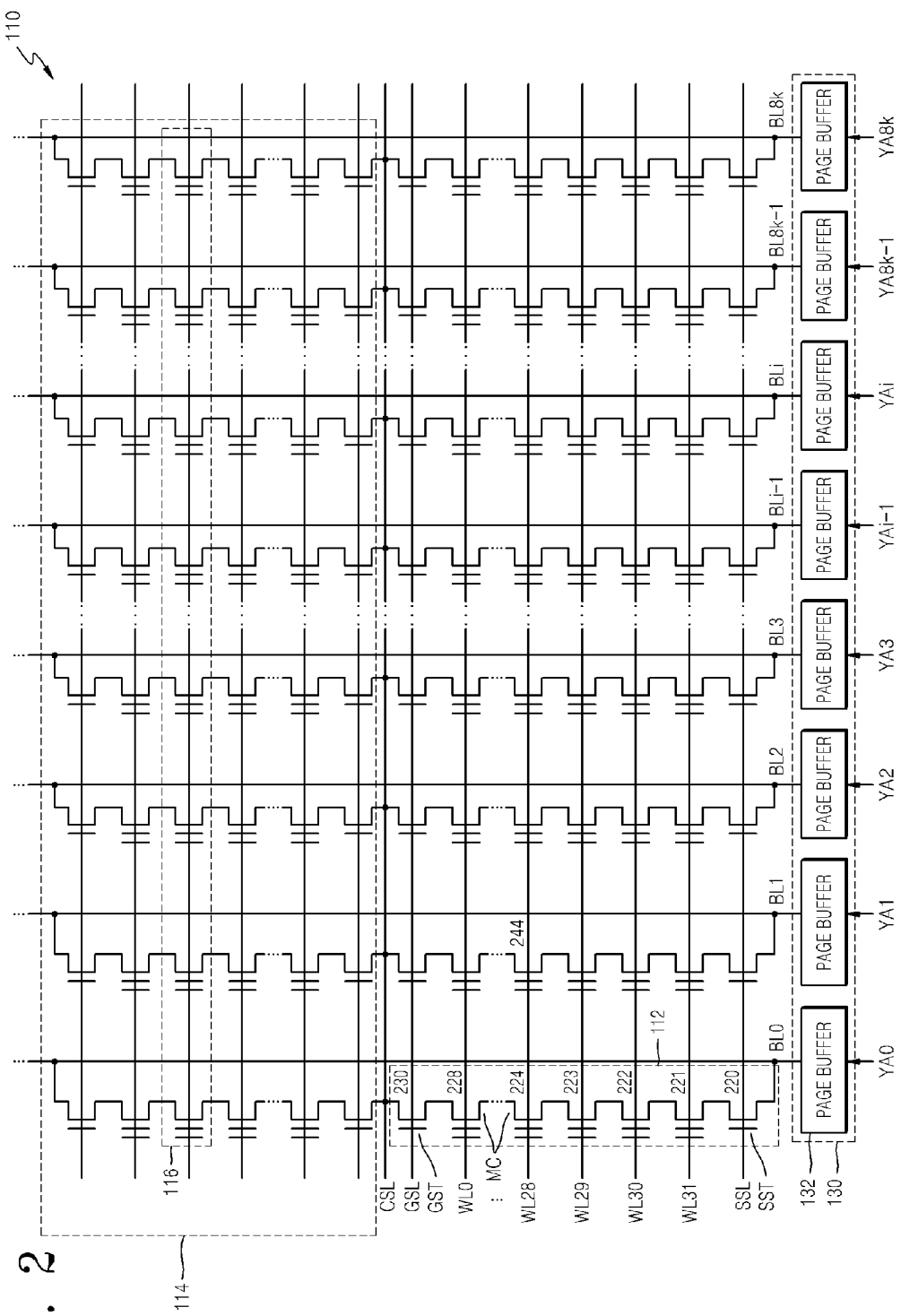
FIG. 2 is a circuit diagram of a memory cell array and a column controller included in the nonvolatile memory device of FIG. 1 according to an embodiment of the inventive concept.

FIG. 2 is a circuit diagram of memory cell array 110 and column controller 130 in nonvolatile memory device 100 of FIG. 1 according to an embodiment of the inventive concept.

Referring to FIG. 2, memory cell array 110 comprises a plurality of NAND strings 112. In this example, each of NAND strings 112 comprises thirty-two memory cells MCs, a string selection transistor SST 220, and a ground selection transistor GST 230, arranged in series. Ground selection transistor GST 230 is connected to a common source line CSL, and string selection transistor SST 220 is connected to a bit line BL0. Control gates of memory cells MCs arranged in rows are connected to word lines WL0, ..., WL29, WL30, WL31, respectively. A gate of ground selection transistor GST 230 is connected to a ground selection line GSL. A gate of string selection transistor SST 220 is connected to a string selection line SSL.

Although FIG. 2 shows thirty-two memory cells MC arranged in each of NAND strings 112, the total number of memory cells MCs in each of NAND strings 112 can be modified to be greater or less than thirty two. For example, each of NAND strings 112 may include eight memory cells MCs, sixteen memory cells MCs, or sixty-four memory cells MCs.

Memory cell array 110 comprises a plurality of blocks 114. A representative one of memory blocks 114 is indicated by a dashed line. Each of blocks 114 comprises a plurality of NAND strings 112. In memory cell array 110, data is erased in units of memory blocks 114. A plurality of memory cells MCs 116 arranged in units of bit lines and connected to one word line (indicated with a dashed line) constitute one page. Data is written to or read from the plurality of memory cells MCs 116.

Column controller 130 comprises a plurality of page buffers 132. Bit lines BL0, BL1, ..., BL8$k$−1 and BL8$k$ are connected to respective page buffers 132. A structure in which bit lines BL0, BL1, ..., BL8$k$−1 and BL8$k$ are connected to page buffers 132, respectively, is referred to as an all bit line (ABL) structure. Address signals YA0, YA1, ..., YA8$k$−1 and YA8$k$ are supplied to respective page buffers 132.

Figure 3:
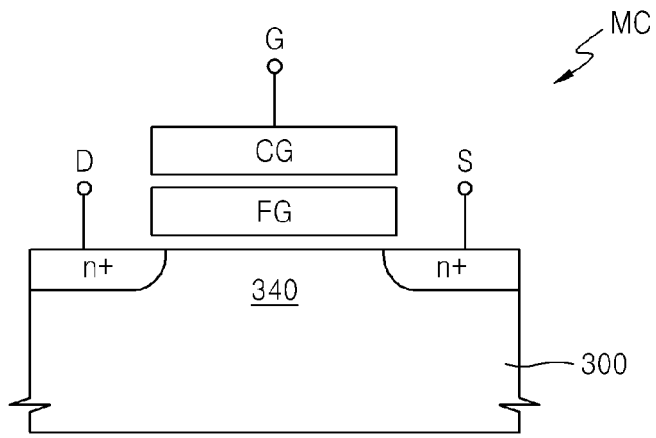
FIG. 3 is a cross-sectional view of a memory cell illustrated in FIG. 2 according to an embodiment of the inventive concept.

FIG. 3 is a cross-sectional view of one of memory cells MC illustrated in FIG. 2 according to an embodiment of the inventive concept.

Referring to FIG. 3, a memory cell MC comprises a gate G, and a source region S and a drain region D formed as n+ regions in a semiconductor substrate 300 and having a channel region 340 therebetween. A floating gate FG is formed on channel region 340 with a thin insulating layer (not shown) disposed therebetween. A control gate CG is formed on floating gate FG with a thin insulating layer (not shown) disposed therebetween. Voltages for performing the program operation, the erase operation, and the read operation are applied to source region S, drain region D, floating gate FG, control gate CG, and semiconductor substrate 300.

Figure 4:
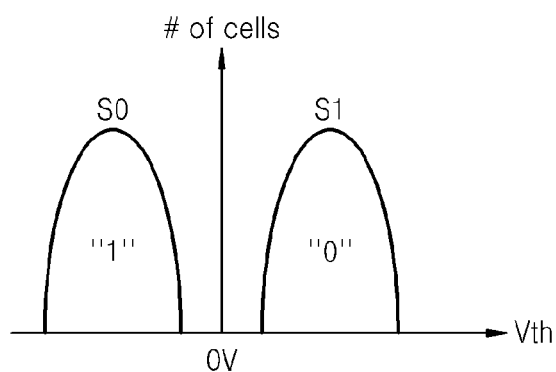
FIG. 4 is a graph illustrating a distribution of threshold voltages of a single-level cell (SLC) flash memory device according to an embodiment of the inventive concept.

Memory cell MC can store analog or digital data. Memory cell MC storing 1-bit digital data is referred to as a single-level memory cell. Where 1-bit digital data is stored in memory cell MC, a threshold voltage (Vth) range of memory cell MC can be divided into two segments representing a logic state '1' (S0) and a logic state '0' (S1), respectively, as illustrated in FIG. 4. After memory cell MC is erased, its threshold voltage is negative and is defined as logic state '1', and after memory cell MC is programmed, its threshold voltage is positive and is defined as logic state '0'. Where the threshold voltage is negative and a read operation is performed on memory cell MC by applying 0V to control gate CG thereof, memory cell MC is turned 'on' to indicate that data '1' is stored in memory cell MC. Where the threshold voltage is positive and the read operation is performed on memory cell MC by applying 0V to control gate CG thereof, memory cell MC is turned 'off' to indicate that data '0' is stored in memory cell MC.

Figure 5:
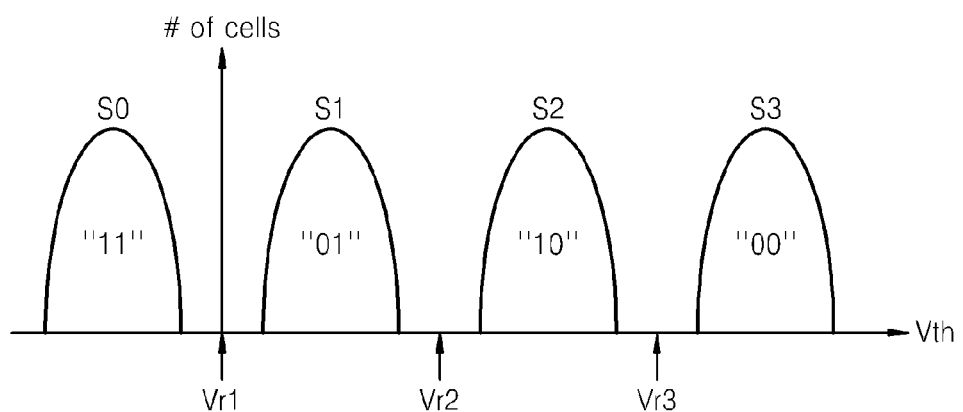
FIG. 5 is a graph illustrating a distribution of threshold voltages of a multi-level cell (MLC) flash memory device according to an embodiment of the inventive concept.

Memory cell MC can alternatively store multi-bit data. Where memory cell MC stores multi-bit data, it is referred to as a multi-level memory cell, or MLC. For example, where 2-bit data is stored in memory cell MC, different threshold (Vth) voltages ranges of memory cell MC can be categorized into four groups assigned to logic states '11' (S0), '01' (S1), '10' (S2), '00' (S3), respectively, which may be read using read voltages Vr1, Vr2 and Vr3 as illustrated in FIG. 5. After it is erased, memory cell MC has a negative threshold voltage representing logic state '11'. After it is programmed, memory cell MC has a positive threshold voltage corresponding to one of logic states '01', '10', and '00'.

In a program operation of memory cell MC 224 of FIG. 2, a program voltage Vpgm is applied to control gate CG and a ground voltage Vss is applied to bit line BL0 2. Electrons discharged from channel region 340 below floating gate FG due to the difference between voltages of channel region 340 and floating gate FG are injected into floating gate FG. The electrons accumulate in floating gate FG, causing it to have a negative charge state and increasing the threshold voltage of memory cell MC 224. Program voltage Vpgm is applied to control gate CG of memory cell MC 224 via word line WL28.

Word line WL28 is connected to a memory cell in each of the NAND strings in memory cell array 110. Accordingly, when memory cell MC 224 is programmed, program voltage Vpgm is also applied to a control gate of memory cell MC 244, because these two memory cells MCs 224 and 244 share the same word line WL28. This can cause an error in memory cell MC 244 when memory cell 224 is programmed, as will be described below.

Because program voltage Vpgm is applied to all memory cells connected to the same word line, a memory cell that is not selected, i.e., a memory cell that is not to be programmed (hereinafter, a 'program-prohibited cell'), may be unintentionally programmed For example, memory cell MC 244 is disposed adjacent to memory cell 224 and may be unintentionally programmed when memory cell 224 is programmed Unintentional programming of a program-prohibited cell among memory cells connected to a selected word line is referred to as a 'program disturbance'.

Various methods can be employed to prevent the program disturbance. For example, in a method referred to as 'self-boosting', a power supply voltage Vdd is applied to a bit line corresponding to a NAND string that is not selected during programming, and a pass voltage, e.g., 7V to 10V, is applied to a non-selected word line. The non-selected word line is coupled to a channel region of a non-selected NAND string. Thus, a voltage of the channel region of the non-selected NAND string may be, for example, 6V to 10V. A boosted channel voltage reduces the difference between voltages of a channel region and a floating gate, thereby minimizing the chance of a program disturbance.

Figure 6:
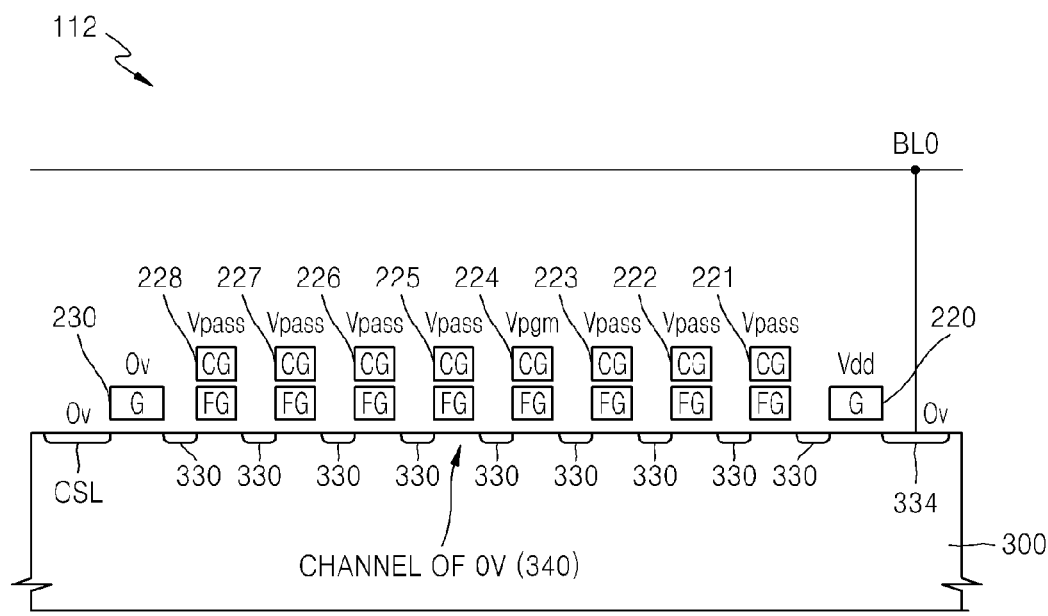
FIG. 6 illustrates a NAND string that is being programmed according to an embodiment of the inventive concept.

FIG. 6 illustrates a NAND string 112 that is being programmed according to an embodiment of the inventive concept. For convenience of explanation, FIG. 6 illustrates NAND string 112 including eight memory cells 221 to 228, where each of eight memory cells 221 to 228 comprises a floating gate FG and a control gate CG. A source/drain region 330 is present between floating gates FG of every two adjacent memory cells. Source/drain region 330 is an N+ type impurity diffusion region formed in a P-type semiconductor substrate 300. Source/drain region 330 can be formed in a P-well in an N-well in semiconductor substrate 300. In general, the P-well can be used for P-type implantation, e.g., channel implantation, to determine a threshold voltage or other characteristics of a memory cell.

A string selection transistor SST 220 is disposed at one end of NAND string 112. String selection transistor 220 is connected to bit line BL0 corresponding to NAND string 112 via a bit line contact 334. A ground selection transistor GST 230 is disposed at the other end of NAND string 112. Ground selection transistor 230 is connected to a common source line CSL. During programming, program voltage Vpgm is applied to a word line corresponding to a memory cell selected to be programmed, for example, a programming cell 224. Program voltage Vpgm may vary, for example, in a range from 12V to 24V.

In some embodiments, program voltage Vpgm is applied using an incremental-step pulse programming (ISPP) scheme. In the ISPP scheme, program voltage Vpgm is gradually increased as program loops of a program cycle are repeatedly performed.

A pass voltage of about 8V is applied to a control gate CG of a memory cell that is not selected to be programmed. Ground selection transistor 230 is isolated by applying 0V to a gate G thereof. A low voltage, e.g., about 0V, is applied to common source line CSL. In general, a power supply voltage Vdd, e.g., about 2.5V, is applied to a gate G of string selection transistor 220. Where 0V is applied to bit line BL0, a selected memory cell 223 is programmed. A voltage of a channel region 340 of selected memory cell 223 is about 0V. Electrons are injected into floating gate FG via a gate oxide layer (not shown) using Fowler-Nordheim tunneling caused by the difference between voltages of channel region 340 of selected memory cell 223 and floating gate FG.

Figure 7:
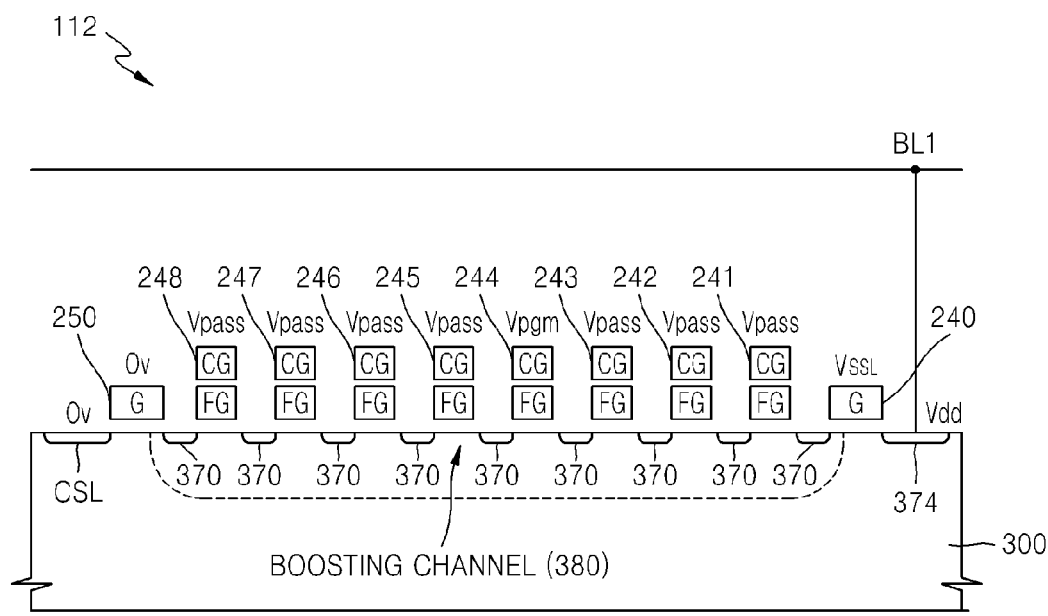
FIG. 7 illustrates a NAND string that is prohibited from being programmed according to an embodiment of the inventive concept.

FIG. 7 illustrates a NAND string 112 that is prohibited from being programmed according to an embodiment of the inventive concept.

Referring to FIG. 7, NAND string 112 comprises eight memory cells 241 to 248. NAND string 112 comprises a string selection transistor SST 240 connected to a bit line BL1, which is also connected to NAND string 112 via a bit line contact 374, and a ground selection transistor GST 250 that connects NAND string 112 to a common source line CSL. A source/drain region 370 is present between floating gates FG of every two adjacent memory cells. In NAND string 112, a string selection line voltage VSSL is applied to a gate G of string selection transistor 240, and 0V is applied to a gate G of ground selection transistor 250. A power supply voltage Vdd is applied to bit line BL1 to prevent memory cell MC 244 from being programmed.

Where power supply voltage Vdd is applied to bit line BL1, string selection transistor 240 is initially in a conductive state, and a channel region channel region 380 of NAND string 112 is partially precharged to a high electric potential. That is, boosting channel region 380 of NAND string 112 is precharged to an electric potential that is higher than 0V and is equal to or approximately equal to power supply voltage Vdd. Such an operation is generally referred to as 'precharging'. Where a channel potential reaches power supply voltage Vdd or a (Vdd−Vt) voltage, where 'Vt' is equal to a threshold voltage of string selection transistor 240), precharging ends automatically.

In general, while precharging is performed, string selection line voltage VSSL is set to satisfy VSSL−Vt>Vdd. Thus, boosting channel region 380 below NAND string 112 is precharged to power supply voltage Vdd. Where boosting channel region 380 reaches a potential corresponding to power supply voltage Vdd, string selection transistor 240 is turned off by lowering the string selection line voltage VSSL to be similar to power supply voltage Vdd.

Next, a pass voltage Vpass and program voltage Vpgm increase from 0V to target levels thereof, respectively. Because string selection transistor 240 is turned off, the channel potential begins to increase due to capacitive coupling between a word line and boosting channel region 380. This phenomenon is referred to as 'self-boosting'. As boosting channel region 380 is boosted to a boost voltage, the difference between voltages of memory cell MC 244 and boosting channel region 380 decreases, thereby preventing unwanted programming.

Where programming is performed as described above, a distribution of threshold voltages of a programmed cell is as illustrated in FIG. 5. However, electrons stored in a floating gate FG of the programmed cell may leak due to various causes. For example, electrons stored in floating gate FG may leak due to an external cause, such as heat, or they may leak due to wear on the memory cell. Such wear can result from the programmed cell being repeatedly accessed, causing deterioration of an insulating layer between a channel region and floating gate FG. This can cause electrons stored in floating gate FG to leak, decreasing a threshold voltage of the programmed cell. Such access of the flash memory device includes program operations, erase operations, and read operations.

Figure 8:
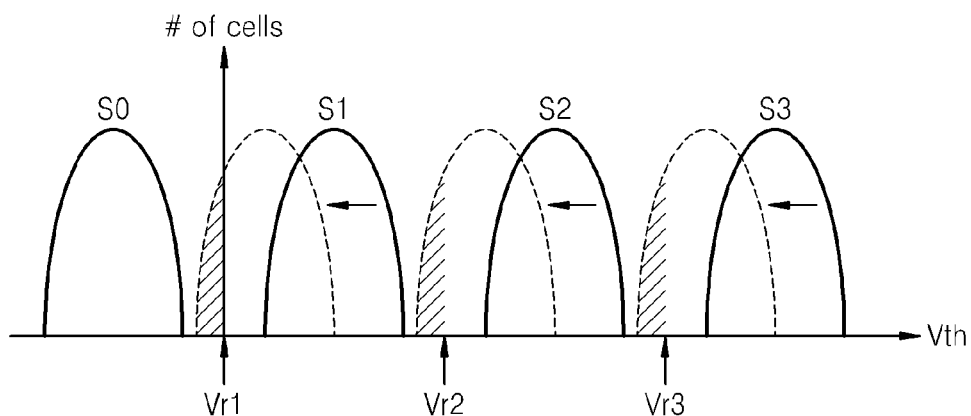
FIG. 8 is a graph illustrating a decrease in the distribution of threshold voltages illustrated FIG. 5 according to an embodiment of the inventive concept.

FIG. 8 is a graph illustrating a decrease in the distribution of threshold voltages (Vth) of a memory cell MC illustrated FIG. 5 according to an embodiment of the inventive concept. Similar to FIG. 5, the memory cell may be programmed in one of states S0, S1, S2 and S3. In FIG. 8, a solid line indicates a distribution of initial threshold voltages of a memory cell, and a dashed line denotes a reduction in the distribution of threshold voltages due to an external cause or wearing out of the memory cell. In FIG. 8, shaded (diagonal lines) regions of the graph indicate that the memory cell is in an 'S0' state due to a reduction in the threshold voltage thereof although the memory cell is programmed to an 'S1' state. In this case, an error occurs in the read operation using the read voltages Vr1, Vr2 and Vr3, thereby lowering the reliability of a flash memory device.

Figure 9:
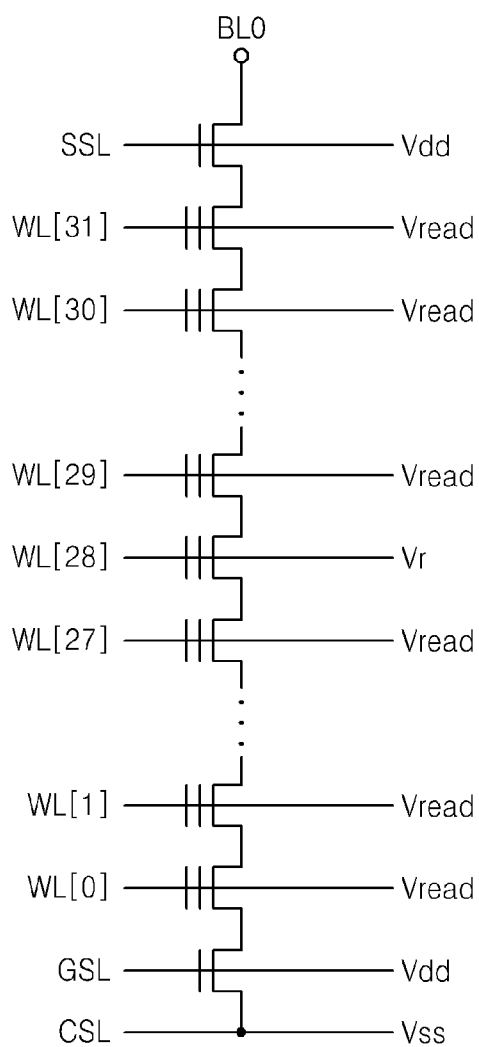
FIG. 9 is a circuit diagram illustrating bias conditions of a read operation of a nonvolatile memory device according to an embodiment of the inventive concept.

FIG. 9 is a circuit diagram illustrating conditions of a read operation of a nonvolatile memory device according to an embodiment of the inventive concept. The read operation determines a data state of a memory cell, i.e., whether the memory cell is programmed FIG. 9 illustrates bias conditions when the read operation is performed on a NAND string, e.g., NAND string 112 of FIG. 2. A power supply voltage Vdd is applied to a string selection line SSL. Where power supply voltage Vdd is applied to string selection transistor SSL, string selection transistor SSL is turned on. NAND string 112 is connected to bit line BL0. Where a read voltage Vread is applied to non-selected transistors connected to non-selected word lines, the non-selected transistors are turned on.

A reference read voltage Vr is applied to a selected word line. Then, the selected memory cell is turned on or off according to a data state thereof. In other words, a memory cell selected to be programmed is turned off and other memory cells that are not selected to be programmed are turned on. Power supply voltage Vdd is applied to a ground selection line GSL. Then, ground selection transistor GSL is turned on. Thus, NAND string 112 is connected to common source line CSL.

Before the read operation is performed, precharging is performed to precharge bit line BL0 to power supply voltage Vdd. Then, bias conditions for the read operation described above with reference to FIG. 9 are provided so that the supply of current to NAND string 112 is controlled depending on whether the selected memory cell is turned on or off. Where the selected memory cell is turned on, current flows through the selected memory cell and a voltage of bit line BL0 becomes lower than power supply voltage Vdd. Where the selected memory cell is turned off, current does not flow through the selected memory cell, and the voltage of bit line BL0 is kept equal to power supply voltage Vdd. Such an operation is referred to as 'developing'. The developing voltage of bit line BL0 is sensed by a page buffer 132 illustrated in FIG. 12, which will be described below.

Figure 10:
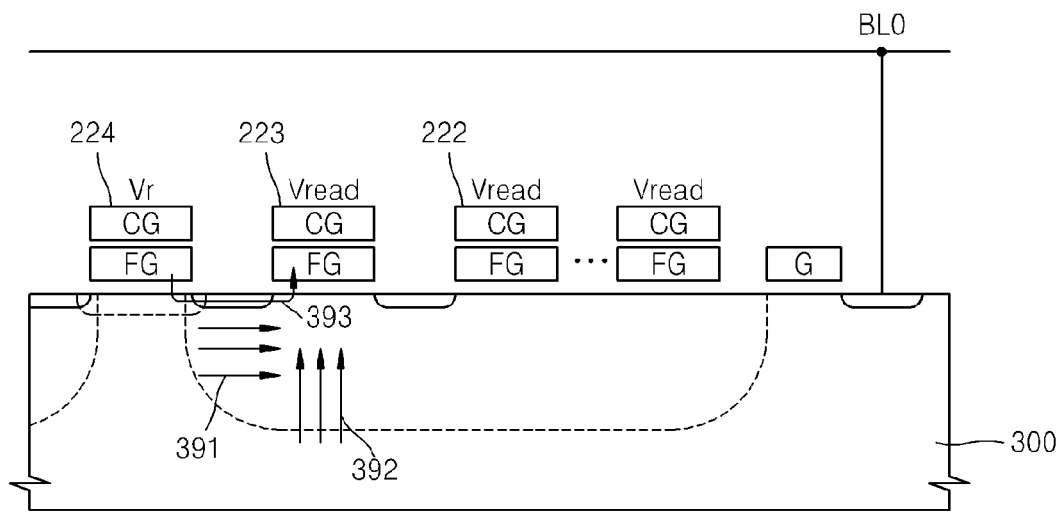
FIG. 10 illustrates a read disturbance occurring when a read operation is performed by a flash memory device according to an embodiment of the inventive concept.

FIG. 10 illustrates a read disturbance occurring when a read operation of a flash memory device is performed according to an embodiment of the inventive concept.

Referring to FIG. 10, when data is read from a selected memory cell 224, bit line BL0 is precharged to a power supply voltage Vdd, a reference read voltage Vr of 0V is applied to a word line of selected memory cell 224, and a read voltage Vread is applied to word lines of memory cells 222 and 223 that are not selected. In the figure, G denotes a gate for connecting the bit line BL0 to memory cell string. Among non-selected memory cells 222 and 223, channel boosting occurs in memory cell 223 adjacent to selected memory cell 224 due to read voltage Vread applied to the word line, and strong horizontal and vertical electric fields are formed as indicated by arrows 391 and 392. The strong horizontal and vertical electric fields cause electrons forming a leakage current in a channel of selected memory cell 224 to become hot carriers having high energy. The hot carriers are injected into a floating gate FG of memory cell 223 adjacent to selected memory cell 224, as indicated with arrow 393, causing the read disturbance that increases a threshold voltage of memory cell 223.

Figure 11:
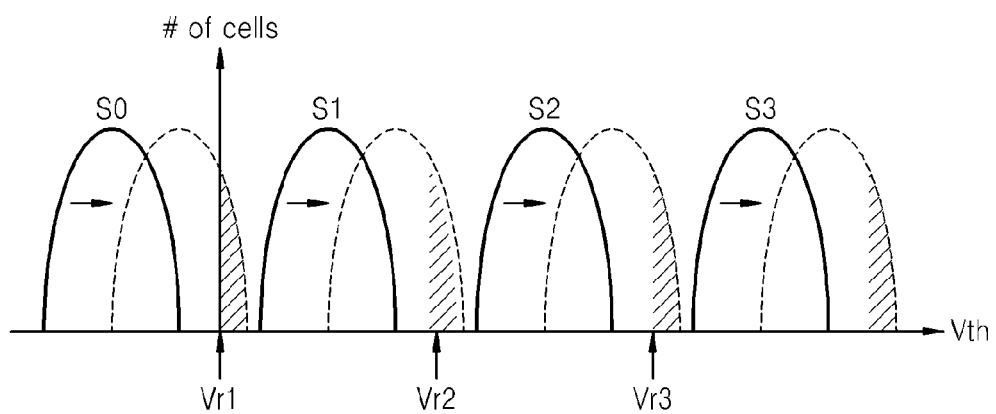
FIG. 11 is a graph illustrating an increase in the distribution of threshold voltages of memory cells of FIG. 5 according to an embodiment of the inventive concept.

FIG. 11 is a graph illustrating an increase of threshold voltages of memory cells of FIG. 5 according to an embodiment of the inventive concept. Similar to FIG. 5, the memory cell may be programmed in one of states S0, S1, S2 and S3. In FIG. 11, a solid line indicates a distribution of initial threshold voltages of the memory cell, and a dashed line indicates an increase in the distribution of threshold voltages due to the read disturbance. In FIG. 11, shaded (diagonal lines) regions of the graph indicate that the memory cell is in an 'S2' state due to an increase in the threshold voltage thereof although the memory cell is programmed to an 'S1' state. In this case, an error occurs in the read operation using the read voltages Vr1, Vr2 and Vr3, lowering the reliability of a flash memory device.

Figure 12:
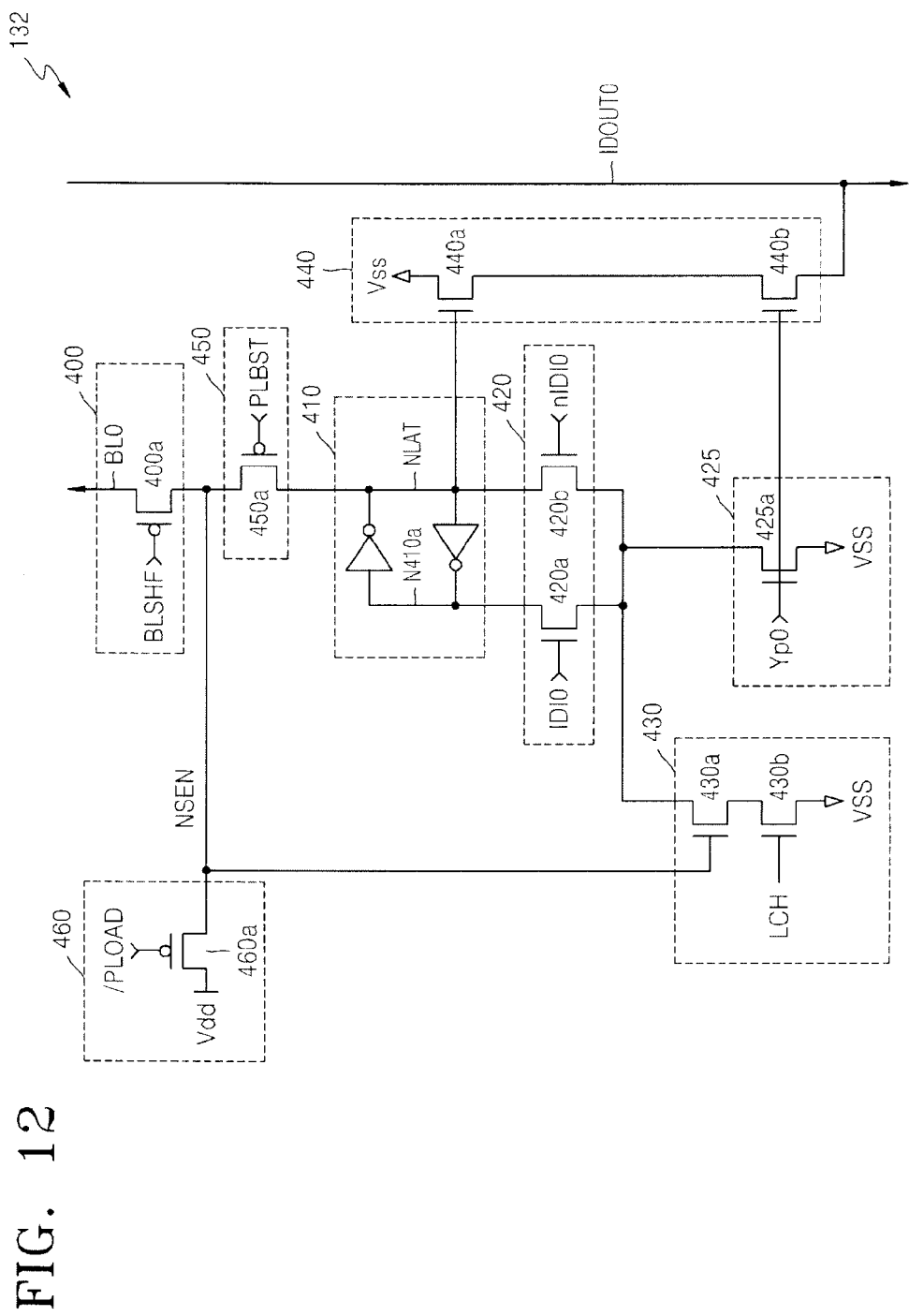
FIG. 12 is a circuit diagram of a page buffer included in the column controller of FIG. 2 according to an embodiment of the inventive concept.

FIG. 12 is a circuit diagram of one of page buffers 132 in column controller 130 of FIG. 2 according to an embodiment of the inventive concept.

Referring to FIG. 12, page buffer 132 comprises a sensing node NSEN, a bit line connection unit 400, a latch unit 410, a latch transmission unit 420, a latch driving unit 425, a sensing response unit 430, an output driving unit 440, a buffer selection unit 450, a precharge unit 460, and a data output line IDOUT0.

Bit line connection unit 400 controls a connection between bit line BL0 and sensing node NSEN according to bit line connection signal BLSHF. Bit line connection unit 400 comprises a bit line connection transistor 400a. Bit line connection transistor 400a can be an NMOS transistor having a gate connected to bit line connection signal BLSHF. A voltage of bit line BL0 is controlled according to a voltage of bit line connection signal BLSHF. Also, bit line connection transistor 400a controls the voltage of bit line BL0 according to an active period of bit line connection signal BLSHF.

Latch unit 410 comprises a latch node NLAT that stores data corresponding to data of bit line BL0. Latch driving unit 425 is enabled according to a buffer selection address Yp0 to apply a latch driving voltage. In the embodiment of FIG. 12, the latch driving voltage is equal to ground voltage VSS and is independent of data provided to latch transmission unit 420 via first and second internal input lines IDIO and nIDIO. Latch driving unit 425 comprises a latch driving transistor 425a. Latch driving transistor 425a is gated according to buffer selection address Yp0, and it can be an NMOS transistor having a source terminal to which ground voltage VSS is applied.

Latch transmission unit 420 comprises first and second latch transmission transistors 420a and 420b. First latch transmission transistor 420a applies a latch driving voltage received from latch driving transistor 425a to a node N410a of latch unit 410 according to data of the first internal input line IDIO. First latch transmission transistor 420a is connected to latch driving transistor 425a and it can be an NMOS transistor gated according to the data of the first internal input line IDIO. Where buffer selection address Yp0 is in a logic 'H' state and data in the logic 'H' state is supplied to the first internal input line IDIO, first latch transmission transistor 420a applies ground voltage VSS to node N410a of latch unit 410.

Second latch transmission transistor 420b applies the latch driving voltage received from latch driving transistor 425a to node N410a of latch unit 410 according to data of second internal input line nDIO. Second latch transmission transistor 420b is connected to latch driving transistor 425a and it can be an NMOS transistor gated according to the data of second internal input line nDIO. Where buffer selection address Yp0 is in the logic 'H' state and data in the logic 'H' state is supplied to the second internal input line nDIO, second latch transmission transistor 420b applies ground voltage VSS to latch node NLAT of latch unit 410.

In the embodiment of FIG. 12, where first latch transmission transistor 420a is turned on, data in the logic 'H' state is stored in latch node NLAT, and where second latch transmission transistor 420b is turned on, data in a logic 'L' state is stored in latch node NLAT.

Sensing response unit 430 is driven by sensing node NSEN to apply a sensing response voltage to latch transmission unit 420, and it controls the data stored in latch node NLAT. The sensing response voltage may be ground voltage VSS. Sensing response unit 430 comprises a sensing response transistor 430a and an output sensing transistor 430b.

Sensing response transistor 430a can be an NMOS transistor that is gated according to data of sensing node NSEN. Output sensing transistor 430b can be an NMOS transistor connected in series to sensing response transistor 430a and it can have a source terminal to which ground voltage VSS is applied. Where sensing response transistor 430a is turned on, output sensing transistor 430b controls the sensing response voltage to be applied to latch unit 410 via latch transmission unit 420 according to a read latch signal LCH. Latch node NLAT stores data corresponding to sensing node NSEN according to the sensing response voltage.

Precharge unit 460 precharges sensing node NSEN to a precharge voltage. The precharge voltage is typically equal to a power supply voltage Vdd, and precharge unit 460 comprises a precharge transistor 460a. Precharge transistor 460a can be a PMOS transistor having a source terminal to which power supply voltage Vdd is applied, and may be gated according to a precharge signal /PLOAD.

Output driving unit 440 is enabled according to buffer selection address Yp0. Where output driving unit 440 is enabled, output driving unit 440 drives data output line IDOUT0 to a drive voltage, according to the data stored in latch node NLAT. Output driving unit 440 comprises a first output driving transistor 440a and a second output driving transistor 440b.

First output driving transistor 440a is gated according to the data stored in latch node NLAT of latch unit 410. Where the data stored in latch node NLAT of latch unit 410 is logic 'H', first output driving transistor 440a is turned on. Second output driving transistor 440b is connected in series to first output driving transistor 440a. Second output driving transistor 440b is gated according to buffer selection address Yp0 to drive data output line IDOUT0 to the drive voltage. In the embodiment of FIG. 12, the drive voltage is ground voltage VSS applied to a source terminal of first output driving transistor 440a. Accordingly, where the data stored in latch node NLAT is logic 'H', buffer selection address Yp0 changes to the logic 'H' state and data output line IDOUT0 is thus driven with ground voltage VSS.

Buffer selection unit 450 controls a connection between latch node NLAT and sensing node NSEN. Buffer selection unit 450 comprises a buffer selection transistor 450a. Buffer selection transistor 450a can be an NMOS transistor that is gated according to a buffer selection signal PBLST. Where a voltage of buffer selection signal PBLST transitions to logic 'H', then the data of latch node NLAT is transmitted to sensing node NSEN via buffer selection transistor 450a and is then transmitted to bit line BL0.

In page buffer 132, the voltage of sensing node NSEN precharged to power supply voltage Vdd by using precharge unit 460 is transferred to bit line BL0 via bit line connection unit 400. In this case, the precharge voltage of bit line BL0 causes channel boosting. The precharge voltage of bit line BL0 varies according to a voltage of bit line connection signal BLSHF.

Where the degree of channel boosting decreases during the read operation, it is possible to reduce strong horizontal and vertical electric fields as indicated by arrows 391 and 392 in FIG. 10. Channel boosting is influenced by the precharge voltage of bit line BL0. Thus, a reduction in the precharge voltage of bit line BL0 prevents a threshold voltage of a memory cell from increasing. However, where the threshold voltage of the memory cell decreases due to an external cause or wearing out of the memory cell, the effect of channel boosting may increase to increase the threshold voltage of the memory cell by increasing the precharge voltage of bit line BL0.

Figure 13:
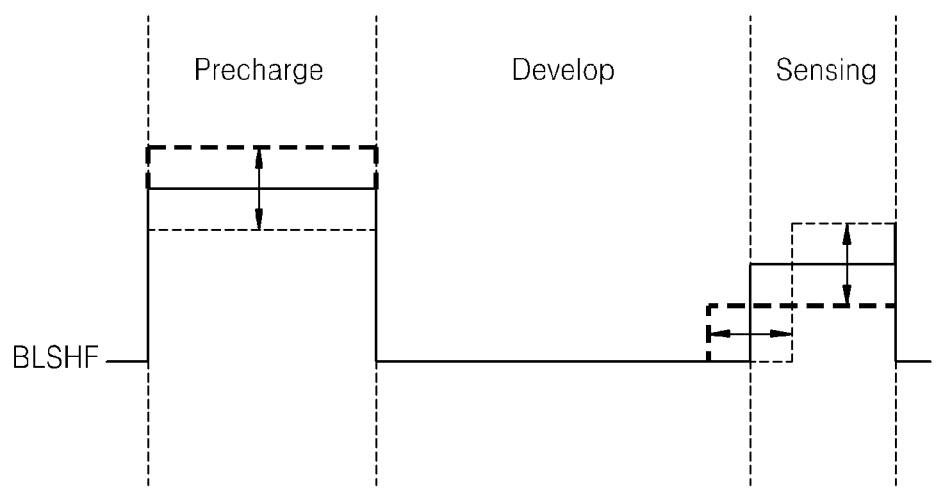
FIG. 13 is a waveform diagram of a bit line connection signal during a read operation according to an embodiment of the inventive concept.

FIG. 13 is a waveform diagram of bit line connection signal BLSHF during a read operation according to an embodiment of the inventive concept. In FIG. 12, bit line connection signal BLSHF turns on bit line connection transistor 400a to connect sensing node NSEN and bit line BL0 to each other. In FIG. 13, a solid line indicates a voltage of bit line connection signal BLSHF when a normal read operation is performed. That is, the solid line indicates a default voltage of bit line connection signal BLSHF when a threshold voltage of a memory cell exhibits a normal distribution, i.e., the initial threshold voltage illustrated in FIG. 5. The read operation comprises a precharge period, a developing period, and a sensing period. The precharge section, the developing section, and the sensing section are related to operation of page buffer 132 described above with reference to FIG. 12.

The voltage of bit line connection signal BLSHF can be changed in the precharge section or the sensing section to change the distribution of threshold voltages of the memory cell. Bit line connection signal BLSHF changes a time period of the developing section.

For example, where the threshold voltage of the memory cell decreases as illustrated in FIG. 8, bit line connection signal BLSHF is set to have a high voltage in the precharge section and to have a low voltage in the sensing section, as indicated with a thick dashed line. That is, bit line connection signal BLSHF is set to increase the difference between voltages of bit line connection signal BLSHF in the precharge section and the sensing section. Also, bit line connection signal BLSHF is set to have a short time period of the developing section.

For example, when the threshold voltage of the memory cell increases as illustrated in FIG. 11, bit line connection signal BLSHF is set to have a low voltage in the precharge section and to have a high voltage in the sensing section, as indicated with a thin dashed line. That is, bit line connection signal BLSHF is set to reduce the difference between voltages of bit line connection signal BLSHF in the precharge section and the sensing section. Also, bit line connection signal BLSHF is set to have a long time period of the developing section.

Figure 14:
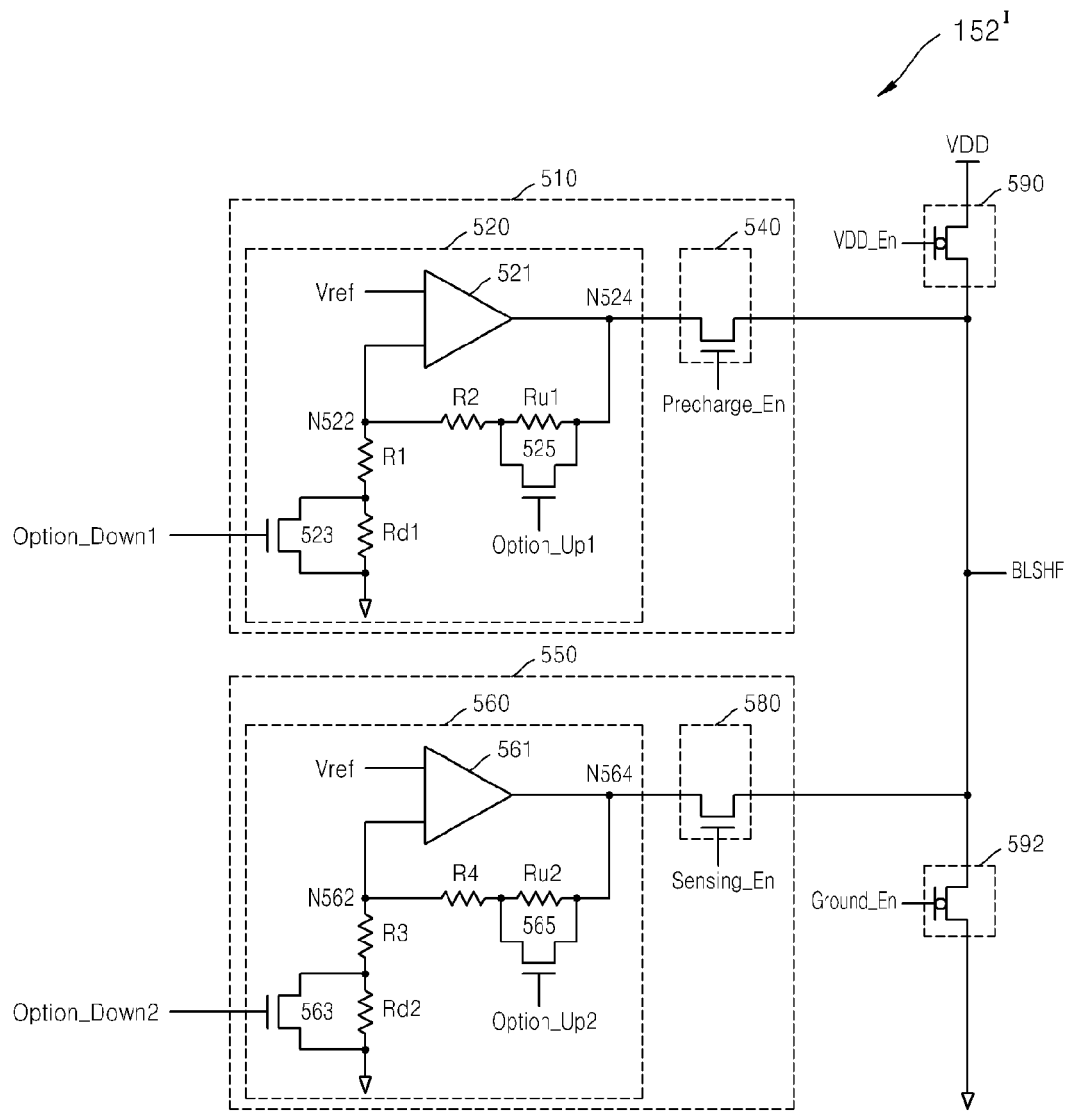
FIG. 14 is a circuit diagram of a bit line connection signal controller illustrated in FIG. 1 according to an embodiment of the inventive concept.
Figure 15:
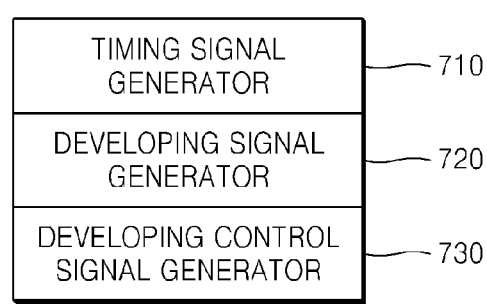
FIG. 15 is a circuit diagram of a bit line connection signal controller illustrated in FIG. 1 according to an embodiment of the inventive concept.

FIGS. 14 and 15 are circuit diagrams of bit line connection signal controllers $152^I$ and $152^{II}$ as examples of the bit line connection signal controller illustrated in FIG. 1 according to different embodiments of the inventive concept. More specifically, FIG. 14 is a circuit diagram of bit line connection signal controller $152^I$ that changes a voltage of bit line connection signal BLSHF in a precharge section and/or a sensing section, according to an embodiment of the inventive concept, and FIG. 15 illustrates bit line connection signal controller $152^{II}$ that changes a time period of a developing section according to another embodiment of the inventive concept.

Referring to FIG. 14, bit line connection signal controller $152^I$ comprises a precharge level controller 510, a sensing level controller 550, a first bias unit 590, and a second bias unit 592. Precharge level controller 510 comprises a precharge voltage generator 520 and a first switching unit 540. Precharge voltage generator 520 comprises a comparator 521 that compares a reference voltage Vref with a voltage of a first node N522. A first resistor R1 and a first down resistor Rd1 are connected between first node N522 and ground voltage Vss source, and a second resistor R2 and a first up resistor Ru1 are connected between first node N522 and an output node N524 of comparator 521. A first NMOS transistor 523 is connected to both terminals of first down resistor Rd1, and a second NMOS transistor 525 is connected to both terminals of first up resistor Ru1. First down signal Option_Down1 is supplied to a gate of first NMOS transistor 523, and a first up signal Option_Up1 is supplied to a gate of second NMOS transistor 525.

First down signal Option_Down1 and first up signal Option_Up1 are provided from external host 10 of FIG. 1. External host 10 of FIG. 1 generates first down signal Option_Down1 and first up signal Option_Up1 when an error occurs during a read operation and cannot be corrected. Where first down signal Option_Down1 and first up signal Option_Up1 are selectively activated, a voltage of output node N524 of comparator 521 changes. For example, where first down signal Option_Down1 and first up signal Option_Up1 that are logic 'L' are supplied, first and second NMOS transistors 523 and 525 are turned on and first down resistor Rd1 and first up resistor Ru1 are short-circuited, thus lowering the voltage of output node N524 of comparator 521. Where first down signal Option_Down1 and first up signal Option_Up1 are activated to logic 'L', first and second NMOS transistors 523 and 525 are turned off and a voltage division is performed by first down resistor Rd1 and first up resistor Ru1, thus increasing the voltage of output node N524 of comparator 521.

First switching unit 540 applies the voltage of output node N524 of comparator 521 to bit line connection signal BLSHF, according to a precharge enable signal Precharge_En. First switching unit 540 can be an NMOS transistor operating according to precharge enable signal Precharge_En. Precharge enable signal Precharge_En is supplied from external host 10. External host 10 generates precharge enable signal Precharge_En when an error occurs during a read operation and cannot be corrected.

Sensing level controller 550 comprises a sensing voltage generator 560 and a second switching unit 580. Sensing voltage generator 560 comprises a comparator 561 that compares reference voltage Vref with a voltage of a second node N562. A third resistor R3 and a second down resistor Rd2 are connected between second node N562 and ground voltage VSS source, and a fourth resistor R4 and a second up resistor Ru2 are connected between second node N562 and an output node N564 of comparator 561. A third NMOS transistor 563 is connected to both terminals of second down resistor Rd2, and a fourth NMOS transistor 565 is connected to both terminals of second up resistor Ru2. A second down signal Option_Down2 is supplied to a gate of third NMOS transistor 563, and a second up signal Option_Up2 is supplied to a gate of fourth NMOS transistor 565.

Second down signal Option_Down2 and second up signal Option_Up2 are provided from external host 10. External host 10 generates second down signal Option_Down2 and second up signal Option_Up2 where an error occurs during a read operation and cannot be corrected. Where second down signal Option_Down2 and second up signal Option_Up2 are selectively activated, a voltage of output node N564 of comparator 561 changes.

For example, where second down signal Option_Down2 and second up signal Option_Up2 with logic 'H' are supplied, third and fourth NMOS transistors 563 and 565 are turned on and second down resistor Rd2 and second up resistor Ru2 are short-circuited, thus reducing the voltage of output node N564 of comparator 561. Where second down signal Option- _Down2 and second up signal Option_Up2 are activated to logic 'L', third and fourth NMOS transistors 563 and 565 are turned off and a voltage division is performed by second down resistor Rd2 and second up resistor Ru2, thus increasing the voltage of output node N564 of comparator 561.

Second switching unit 580 applies the voltage of output node N564 of comparator 561 to bit line connection signal BLSHF according to a sensing enable signal Sensing_En. Second switching unit 580 can be an NMOS transistor that operates according to sensing enable signal Sensing_En. Sensing enable signal Sensing_En is provided from external host 10. External host 10 illustrated in FIG. 1 generates sensing enable signal Sensing_En when an error occurs during a read operation and cannot be corrected.

First bias unit 590 applies a power supply voltage Vdd to bit line connection signal BLSHF according to a first bias enable signal VDD_En. First bias unit 590 may be an NMOS transistor that operates according to the first bias enable signal VDD_En. The first bias enable signal VDD_En is provided from control logic unit 150 of FIG. 1, and drives bit line connection signal BLSHF to have power supply voltage Vdd in the precharge section and the sensing section.

Second bias unit 592 applies ground voltage Vss to bit line connection signal BLSHF according to a second bias enable signal Ground_En. Second bias unit 592 may be an NMOS transistor that operates according to the second bias enable signal Ground_En. The second bias enable signal Ground_En is provided from control logic unit 150 of FIG. 1 and drives bit line connection signal BLSHF to have ground voltage VSS in the developing section.

In the embodiment of FIG. 14, bit line connection signal BLSHF is set to have a high voltage in the precharge section and to have a low voltage in the sensing section. That is, bit line connection signal BLSHF is set to increase the difference between voltages of bit line connection signal BLSHF when precharging and sensing are performed, respectively. Thus, in bit line connection unit 400 in page buffer 132 of FIG. 12, a threshold voltage of a memory cell is increased by increasing the precharge voltage to be applied to bit line BL0 according to bit line connection signal BLSHF.

Alternatively, bit line connection signal BLSHF can be set to have a low voltage in the precharge section and to have a high voltage in the sensing section. That is, bit line connection signal BLSHF can be set to reduce the difference between voltages of bit line connection signal BLSHF when precharge and sensing are performed, respectively. Accordingly, in bit line connection unit 400 in page buffer 132 of FIG. 12, the threshold voltage of the memory cell can be reduced by reducing the precharge voltage to be applied to bit line BL0, according to bit line connection signal BLSHF.

Figure 15A:
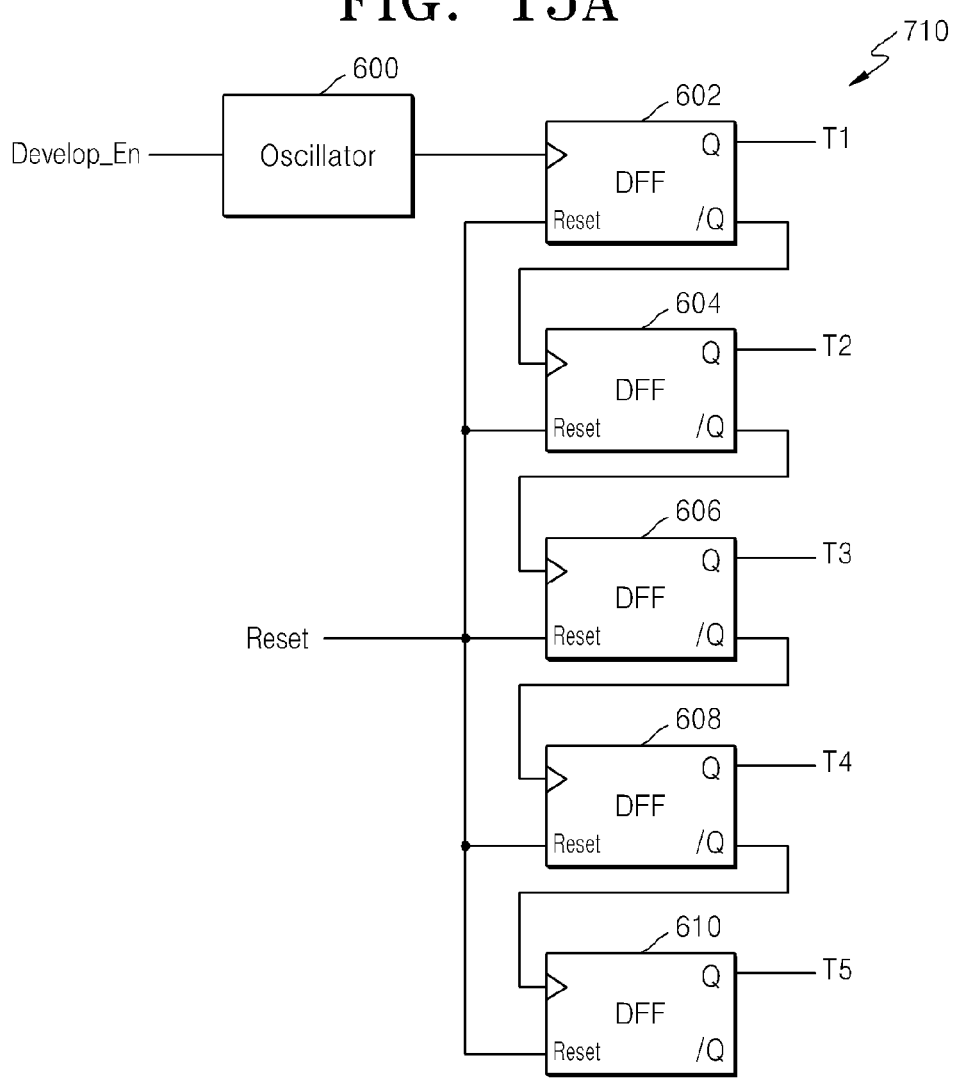

Bit line connection signal controller 152" of FIG. 15 changes a time period of the developing section. Bit line connection signal controller 152" comprises a timing signal generator 710, a developing signal generator 720, and a developing control signal generator 730 illustrated in FIGS. 15A to 15C, respectively. In FIGS. 15A and 15C, DFF denotes a flip-flop.

Referring to FIG. 15A, timing signal generator 710 comprises an oscillator 600 that receives a developing enable signal Develop_En. An output of oscillator 600 is supplied to a clock signal terminal of a first flip-flop 602. First flip-flop 602 generates a first timing signal T1 as an output signal Q thereof, and supplies an inverted output signal /Q of output signal Q to a clock signal terminal of a second flip-flop 604. Second flip-flop 604 generates a second timing signal T2 as an output signal Q thereof, and supplies an inverted output signal /Q of output signal Q to a clock signal terminal of a third flip-flop 606. Third flip-flop 606 generates a third timing signal T3 as an output signal Q thereof, and supplies an inverted output signal /Q of output signal Q to a clock signal terminal of a fourth flip-flop 608. Fourth flip-flop 608 generates a fourth timing signal T4 as an output signal Q thereof, and supplies an inverted output signal /Q of output signal Q to a clock signal terminal of a fifth flip-flop 610. Fifth flip-flop 610 generates a fifth timing signal T5 as an output signal Q thereof. A reset signal Reset is supplied to a reset terminal of each of the first to fifth flip-flops 602, 604, 606, 608, and 610.

Figure 15B:
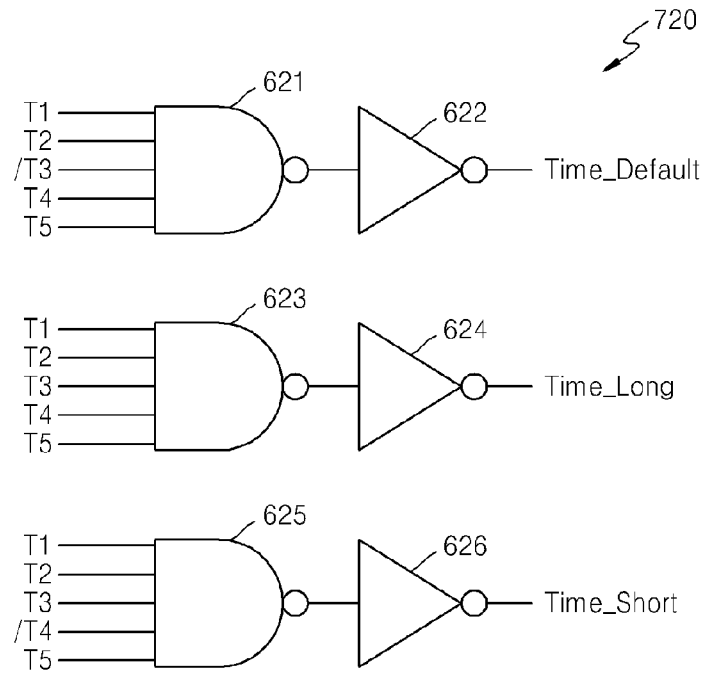
Figure 15C:
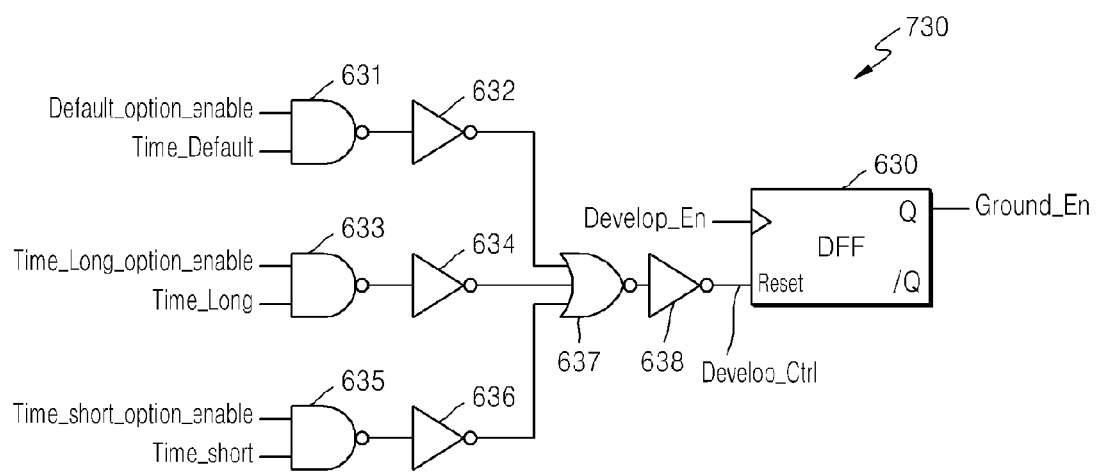

Referring to FIG. 15B, developing signal generator 720 generates a developing default signal Time_Default, a developing long signal Time_Long, and a developing short signal Time_Short from a combination of logics of first to fifth timing signals T1 to T5. First to fifth timing signals T1 to T5 are read as code [MSB:LSB], e.g., code [T5:T1] where /T3 and /T4 are inverted. Developing default signal Time_Default is generated by using a first NAND gate 621 that receives code [11011] and a first inverter 622 that receives an output of first NAND gate 621. Developing long signal Time_Long is generated by using a second NAND gate 623 that receives code [11111] and a second inverter 624 that receives an output of second NAND gate 623. Developing short signal Time_Short is generated by using a third NAND gate 625 that receives code [10111] and a third inverter 626 that receives an output of third NAND gate 625.

Referring to FIG. 15C, developing control signal generator 730 generates a developing control signal Develop_Ctrl by selecting one of a developing default signal Time_Default, a developing long signal Time_Long, and a developing short signal Time_Short according to default option enable signals Default_option_enable, Time_long_option_enable, and Time_short_option_enable. Developing control signal Develop_Ctrl is supplied to a reset terminal of a flip-flop 630. Flip-flop 630 generates a second bias enable signal Ground_En according to the developing enable signal Develop_En, and resets the second bias enable signal Ground_En according to developing control signal Develop_Ctrl. Flip-flop 630 outputs second bias enable signal Ground_En that is logic 'H' according to the developing enable signal Develop_En. Second bias enable signal Ground_En with logic 'H' is supplied to second bias unit 592 of FIG. 14 and drives bit line connection signal BLSHF to ground voltage Vss.

Flip-flop 630 outputs second bias enable signal Ground_En with logic 'L', according to the developing control signal Develop_Ctrl received via the reset terminal thereof. Developing control signal Develop_Ctrl with logic 'L' disconnects bit line connection signal BLSHF and ground voltage VSS source from each other to control a time period of the developing section. Developing control signal Develop_Ctrl is generated via logic gates, namely, fourth, fifth, and sixth NAND gates 631, 633, and 635, that receive the default option enable signals Default_option_enable, Time_long_option_enable, and Time_short_option_enable, the developing default signal Time_Default, the developing long signal Time_Long, and the developing short signal Time_Short.

Fourth NAND gate 631 receives default option enable signal Default_option_enable and developing default signal Time_Default, and supplies an output to a fourth inverter 632. The output of fourth inverter 632 represents a default developing time period. Fifth NAND gate 633 receives long option enable signal Time_long_option_enable and developing long signal Time_Long, and supplies an output to a fifth inverter 634. The output of fifth inverter 634 represents that a developing time period is long. Sixth NAND gate 635 receives short option enable signal Time_short_option_enable and developing short signal Time_Short, and supplies an output to a sixth inverter 636. The output of sixth inverter 636 represents that the developing time period is short. Outputs of fourth to sixth inverters 632, 634, and 636 are sequentially supplied to a NOR gate 637 and a seventh inverter 638 to obtain the developing control signal Develop_Ctrl.

Developing control signal Develop_Ctrl allows second bias enable signal Ground_En to be generated with the default developing time period according to the default option enable signal Default_option_enable and developing default signal Time_Default.

Developing control signal Develop_Ctrl allows second bias enable signal Ground_En to be generated with a long developing time period according to long option enable signal Time_long_option_enable and developing long signal Time_Long. Where the developing time period is longer than the default developing time period, a large amount of discharging current flows through a bit line to reduce a threshold voltage of a memory cell.

Developing control signal Develop_Ctrl allows second bias enable signal Ground_En to be generated with a short developing time period according to short option enable signal Time_short_option_enable and developing short signal Time_Short. Where the developing time period is shorter than the default developing time period, a small amount of discharging current flows through a bit line to increase a threshold voltage of a memory cell.

Figure 16:
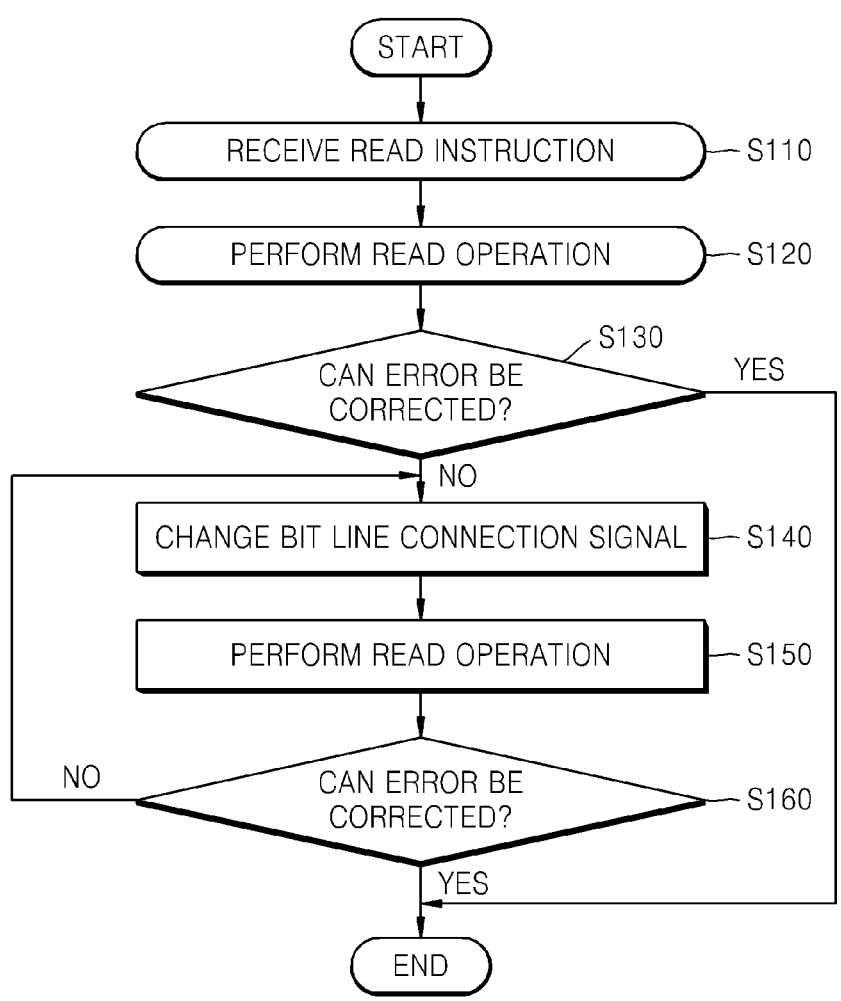
FIG. 16 is a flowchart illustrating a read method performed by a nonvolatile memory device according to an embodiment of the inventive concept.

FIG. 16 is a flowchart illustrating a read method performed by a nonvolatile memory device according to an embodiment of the inventive concept. In the method of FIG. 16, the read method comprises reading, error detection, and changing a signal to be supplied to a bit line.

Referring to FIG. 16, the nonvolatile memory device receives a read instruction from an external source (S110). For example, the nonvolatile memory device can receive the read instruction from a memory controller. Next, the nonvolatile memory device performs reading according to the read instruction (S120). The reading can be performed according to the bias conditions described above with reference to FIG. 9. Then, the nonvolatile memory device determines whether a correctable error has occurred (S130).

Where such an error has occurred (S130=YES), the method is concluded. Otherwise (S130=NO), a voltage of and/or a developing time period of bit line connection signal BLSHF is changed (S140). For example, where a threshold voltage of a memory cell decreases, bit line connection signal BLSHF is set to have a high voltage in a precharge section and to have a low voltage in a sensing section. It is also set to have a short developing time period to increase the threshold voltage of the memory cell. Where the threshold voltage of the memory cell increases, bit line connection signal BLSHF is set to have a low voltage in the precharge section and to have a high voltage in the sensing section. It is also set to have a long developing time period to reduce the threshold voltage of the memory cell.

After the change of bit line connection signal BLSHF, reading is performed again by using the changed bit line connection signal BLSHF (S150). Based on this reading, the method again determines whether an error has occurred and whether the error can be corrected (S160). Where no error has occurred, or the error can be corrected (S160=YES), the method is concluded. Otherwise (S160=NO), the method returns to operation S140.

In the embodiment of FIG. 16, the voltage of and/or the developing time period of bit line connection signal BLSHF is changed according to whether an error in a read operation can be corrected. It is possible to compensate for an increase or a decrease in the threshold voltage of the memory cell by using the changed bit line connection signal BLSHF.

Figure 17:
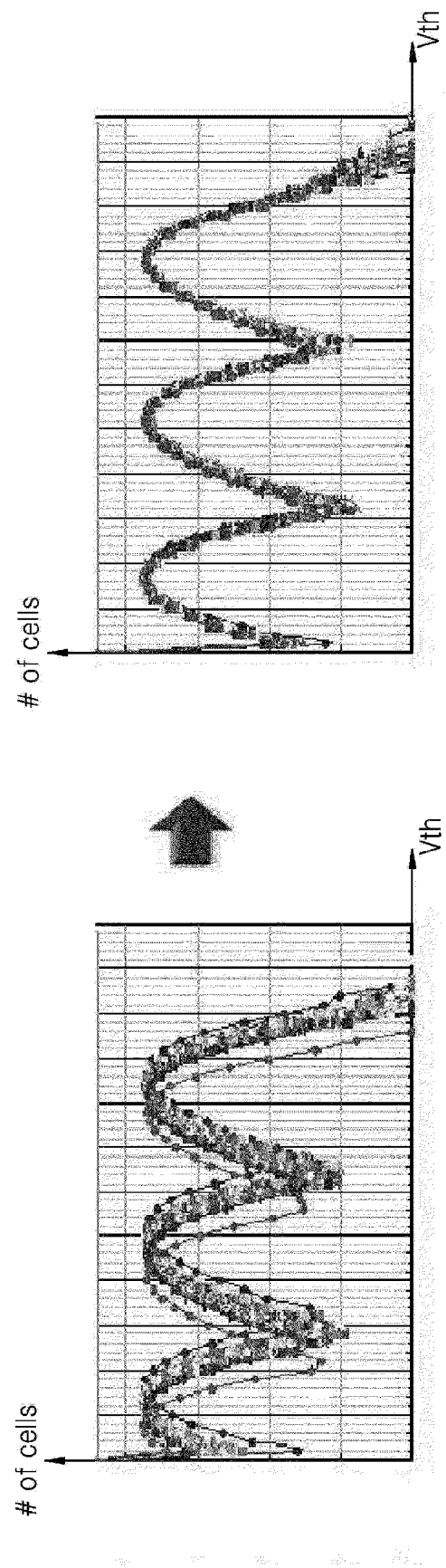
FIG. 17 is a graph illustrating a threshold voltage distribution of a memory cell read by the read method of FIG. 16 according to an embodiment of the inventive concept.

FIG. 17 is a graph showing a threshold voltage (Vth) distribution of a memory cell read by the read method of FIG. 16 according to an embodiment of the inventive concept. More specifically, FIG. 17 illustrates a dispersion of a threshold voltage of a memory cell when the threshold voltage increases due to channel boosting, a program disturbance, or a read disturbance, caused by accessing a nonvolatile memory device or decreases due to an external cause or when the memory cell is worn. However, an increase or decrease in the threshold voltage of the memory cell can be compensated for by performing the read method using the changed bit line connection signal BLSHF as described above with reference to FIG. 16.

Figure 18:
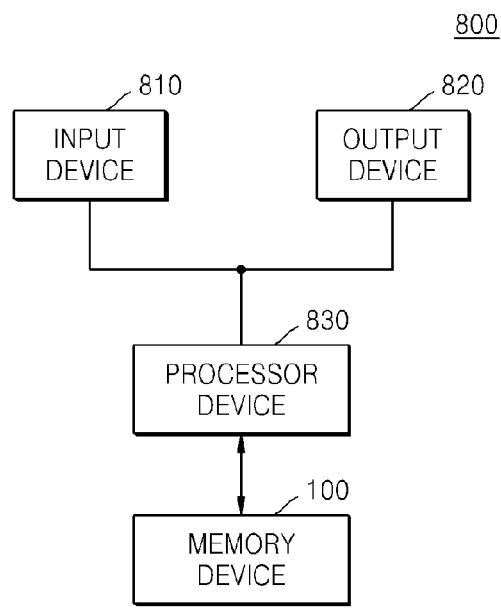
FIG. 18 is a block diagram of an electronic system incorporating the nonvolatile memory device of FIG. 1 according to an embodiment of the inventive concept.

FIG. 18 is a block diagram of an electronic system 800 incorporating a nonvolatile memory device according to an embodiment of the inventive concept.

Referring to FIG. 18, electronic system 800 comprises an input device 810, an output device 820, a processor device 830, and nonvolatile memory device 100. Processor device 830 controls input device 810, output device 820, and nonvolatile memory device 100 via corresponding interfaces, respectively. Processor device 830 can comprise at least one of a microprocessor, a digital signal processor, a microcontroller, and a logic device capable of performing operations similar to those of these devices. Each of input device 810 and output device 820 can comprise at least one of a keypad, a keyboard, and a display device.

Nonvolatile semiconductor device 100 comprises a bit line connection signal controller that changes bit line connection signal BLSHF for connecting a bit line and a page buffer to each other during a read operation. The bit line connection signal controller compensates for a reduction or an increase in a threshold voltage of the memory cell by changing a voltage of and/or a developing time period of bit line connection signal BLSHF.

Figure 19:
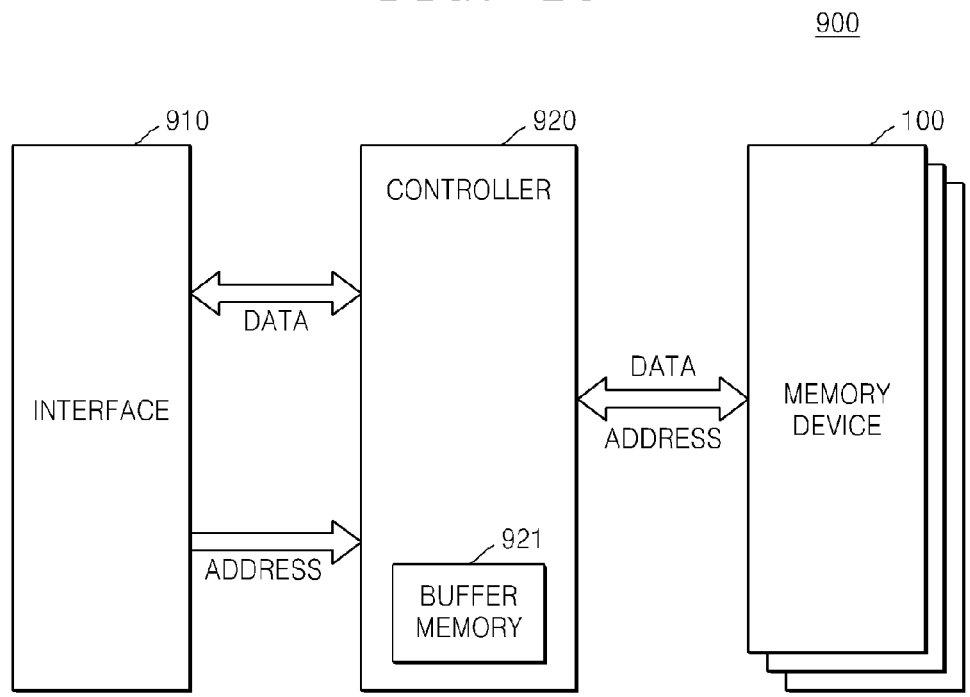
FIG. 19 is a block diagram of a memory system incorporating the nonvolatile memory device of FIG. 1 according to an embodiment of the inventive concept.

FIG. 19 is a block diagram of a memory system 900 incorporating a nonvolatile memory device according to an embodiment of the inventive concept.

Referring to FIG. 19, memory system 900 comprises an interface unit 910, a controller 920, and nonvolatile memory device 100. Interface unit 910 provides an interface between memory system 900 and an external host (not shown). Interface unit 910 implements a data exchange protocol corresponding to the external host for interfacing memory system 900 with the external host. Interface unit 910 can communicate with the external host using one of various standardized interface protocols, such as a universal serial bus (USB) protocol, a multi-media card (MMC) protocol, a peripheral component interconnect-express (PCI-E) protocol, a serial-attached small computer system interface (SCSI) (SAS) protocol, a serial advanced technology attachment (SATA) protocol, a parallel advanced technology attachment (PATA) protocol, a SCSI protocol, an enhanced small disk interface (ESDI) protocol, and an integrated drive electronics (IDE) protocol.

Controller 920 receives data and an address from an external host via interface unit 910. Controller 920 accesses semiconductor device 110 based on the data and the address received from the external host, and transmits data DATA read from nonvolatile memory device 100 to the external host via interface unit 910.

Controller 920 comprises a buffer memory 921 that temporarily stores write data received from the external host or data DATA read from nonvolatile memory device 100. Where data DATA stored in semiconductor device 100 is cached in buffer memory 921 when the external host transmits a read request, buffer memory 921 supports a cache function of directly providing cached data to the external host. In general, the speed of data transmission according to a bus format of the external host, e.g., SATA or SAS, may be significantly faster than the speed of data transmission of a memory channel in memory system 900. Where the interfacing speed of the external host is much higher than that of memory system 900, buffer memory 921 may be used to minimize degradation in performance caused by the difference between the interfacing speeds of the external host and memory system 900.

Nonvolatile memory device 100 comprises a bit line connection signal controller that changes bit line connection signal BLSHF for connecting a bit line and a page buffer to each other during a read operation according to an embodiment of the inventive concept. The bit line connection signal controller compensates for a reduction or an increase in a threshold voltage of a memory cell by changing a voltage or a developing time period of bit line connection signal BLSHF. Nonvolatile memory device 100 can be provided as a storage medium of memory system 900.

Figure 20:
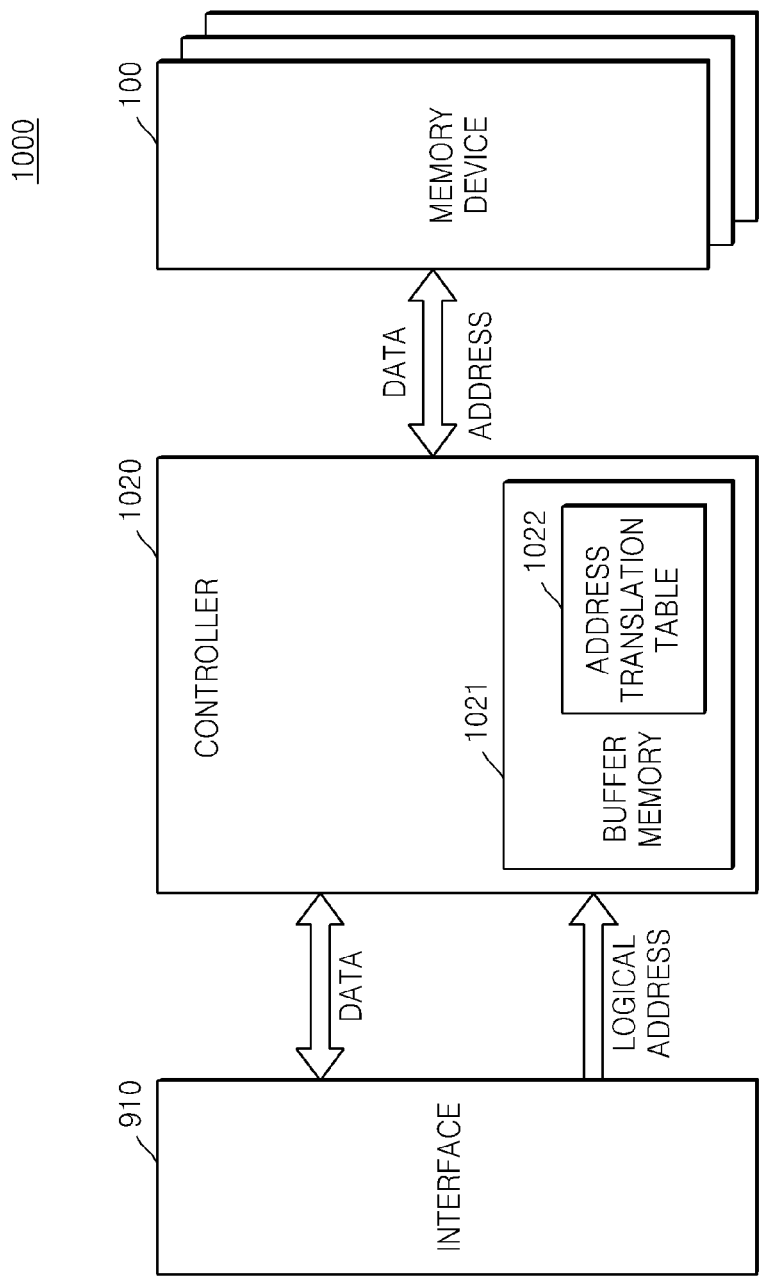
FIG. 20 is a block diagram of a memory system incorporating the nonvolatile memory device of FIG. 1 according to an embodiment of the inventive concept.

FIG. 20 is a block diagram of a memory system 1000 incorporating a nonvolatile memory device according to another embodiment of the inventive concept.

Referring to FIG. 20, memory system 1000 comprises an interface unit 910, a controller 1020, and nonvolatile memory device 100. Interface unit 910 implements a data exchange protocol to interface with an external host as described above with reference to FIG. 19. Nonvolatile memory device 100 comprises a bit line connection signal controller that changes bit line connection signal BLSHF for connecting a bit line and a page buffer to each other during a read operation according to an embodiment of the inventive concept. The bit line connection signal controller compensates for a reduction or an increase in a threshold voltage of a memory cell by changing a voltage or a developing time period of bit line connection signal BLSHF.

Nonvolatile memory device 100 can be used in a semiconductor disc device, such as a solid state drive (SSD). Memory system 1000 can be referred to as a flash memory system. The SSD can be used to replace a hard disc drive (HDD).

Controller 1020 comprises a buffer memory 1021 having an address translation table 1022. Controller 1020 translates a logical address received from interface unit 910 into a physical address using address translation table 1022, and it accesses nonvolatile memory device 100 based on the physical address.

Memory systems 900 and 1000 illustrated in FIGS. 19 and 20 can be installed in an information processing apparatus, such as a personal digital assistant (PDA), a mobile computer, a web tablet, a digital camera, a portable media player (PMP), a mobile phone, a wireless phone, or a laptop computer. Memory systems 900 and 1000 can include an MMC, a Secure Digital (SD) card, a micro SD card, a memory stick, an identification (ID) card, a personal computer memory card international association (PCMCIA) card, a chip card, a USB card, a smart card, or a compact flash (CF) card.

Figure 21:
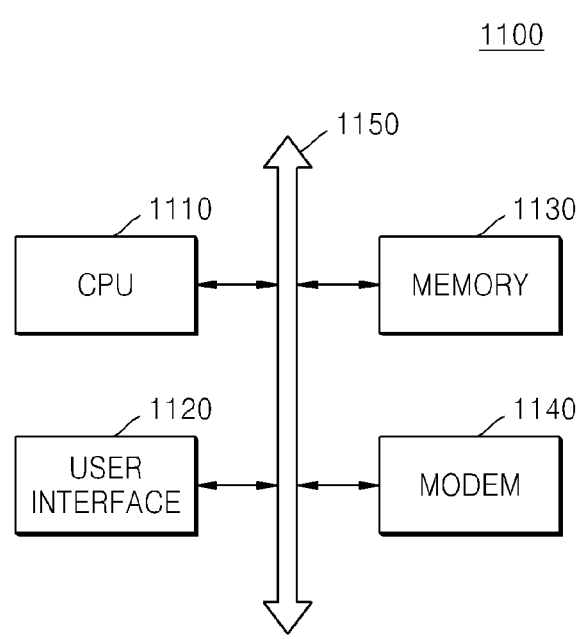
FIG. 21 is a block diagram of a computer system incorporating the nonvolatile memory device of FIG. 1 according to an embodiment of the inventive concept.

FIG. 21 is a block diagram of a computer system incorporating a nonvolatile memory device according to an embodiment of the inventive concept.

Referring to FIG. 21, a computer system 1100 comprises a central processing unit (CPU) 1110, a user interface 1120, a memory 1130, and a modem 1140, such as a baseband chipset, that are electrically connected to a system bus 1150. User interface 1120 is an interface for transmitting or receiving data via a communication network. User interface 1120 can be a wireless/wired type user interface and may include an antenna or a wireless/wired transceiver. Data received via user interface 1120 or modem 1140 or processed by CPU 1110 is stored in memory 1130.

Memory 1130 can be a volatile memory device, such as dynamic random access memory (DRAM), and/or a nonvolatile memory device, such as flash memory. Memory 1130 can be NOR flash memory, NAND flash memory, or a fusion flash memory that is a combination of, for example, an SRAM buffer, a NAND flash memory, and NOR interface logic. The flash memory can comprise a bit line connection signal controller that changes bit line connection signal BLSHF for connecting a bit line and a page buffer to each other during a read operation according to an embodiment of the inventive concept.

Where computer system 1100 is a mobile device, a battery (not shown) that applies an operating voltage to computer system 1100 is further provided. Although not shown, computer system 1100 can further comprise an application chipset, a camera image processor (CIP), and an I/O device.

Where computer system 1100 comprises wireless communication equipment, computer system 1100 can be used in communication systems, such as code division multiple access (CDMA), global system for mobile communication (GSM), North American multiple access (NADC), and CDMA 2000.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device comprising:
   a memory cell array comprising a plurality of word lines and bit lines arranged in rows and columns, and a plurality of memory cells connected to the respective word lines and bit lines;
   a page buffer that connects a selected bit line among the plurality of bit lines to the page buffer, applies a precharge voltage to the selected bit line, and senses a voltage of the selected bit line after developing of the selected bit line according to a bit line connection signal, during a read operation; and
   a bit line connection signal controller that changes the bit line connection signal according to a control signal, during the read operation.

2. The nonvolatile memory device of claim 1, wherein the bit line connection signal controller controls the bit line connection signal to increase a difference between voltages of the bit line connection signal when the selected bit line is precharged and when the selected bit line is sensed, according to the control signal.

3. The nonvolatile memory device of claim 1, wherein the bit line connection signal controller controls the bit line connection signal to reduce a developing time period of the selected bit line, according to the control signal.

4. The nonvolatile memory device of claim 1, wherein the bit line connection signal controller controls the bit line connection signal to reduce a difference between voltages of the bit line connection signal when the selected bit line is precharged and when the selected bit line is sensed, according to the control signal.

5. The nonvolatile memory device of claim 1, wherein the bit line connection signal controller controls the bit line connection signal to increase a developing time period of the selected bit line, according to the control signal.

6. The nonvolatile memory device of claim 1, wherein the control signal comprises a first down signal, a first up signal, a second down signal, and a second up signal, and
the bit line connection signal controller comprises:
a precharge level controller for changing a voltage of a first node according to the first down signal and the first up signal;
a sensing level controller for changing a voltage of a second node according to the second down signal and the second up signal;
a first switching unit for supplying the bit line connection signal to the first node according to a precharge enable signal; and
a second switching unit for supplying the bit line connection signal to the second node according to a sensing enable signal.

7. The nonvolatile memory device of claim 6, wherein the control signal further comprises a first bias enable signal and a second bias enable signal, and
the bit line connection signal controller further comprises:
a first bias unit that applies a power supply voltage to the bit line connection signal according to the first bias enable signal; and
a second bias unit that applies a ground voltage to the bit line connection signal according to the second bias enable signal.

8. The nonvolatile memory device of claim 7, wherein the control signal further comprises a develop enable signal and an option enable signal, and
the bit line connection signal controller further comprises:
a timing signal generator that receives a developing enable signal and outputs a plurality of timing signals;
a developing signal generator that generates a developing default signal, a developing short signal, and a developing long signal from a logic combination of the plurality of timing signals;
a developing control signal generator that selects one of the developing default signal, the developing short signal, and the developing long signal, and outputs the selected signal as a developing control signal according to the option enable signal; and
a flip-flop that outputs a second bias enable signal according to the developing enable signal, and resets the second bias enable signal according to the developing control signal.

9. The nonvolatile memory device of claim 8, wherein an external host determines whether to generate the control signal during the read operation.

10. A method of performing a read operation in a nonvolatile memory device, comprising:
applying a precharge voltage to a bit line selected according to a bit line connection signal;
sensing a voltage of the selected bit line after the selected bit line is developed; and
changing a voltage of the bit line connection signal according to a control signal.

11. The method of claim 10, wherein the bit line connection signal is controlled to increase a difference between voltages of the bit line connection signal when the selected bit line is precharged and when the selected bit line is sensed, according to the control signal.

12. The method of claim 10, wherein the bit line connection signal is controlled to reduce a developing time period of the selected bit line, according to the control signal.

13. The method of claim 10, wherein the bit line connection signal is controlled to reduce a difference between voltages of the bit line connection signal when the selected bit line is precharged and when the selected bit line is sensed, according to the control signal.

14. The method of claim 10, wherein the bit line connection signal is controlled to increase a developing time period of the selected bit line, according to the control signal.

15. The method of claim 10, wherein an external host determines whether to generate the control signal during the read operation.

16. A method of performing a read operation in a nonvolatile memory device, comprising:
(a) reading data from selected memory cells of the nonvolatile memory device;
(b) determining whether the data contains at least one error that cannot be corrected by an error correction circuit; and
(c) upon determining that the data contains at least one error that cannot be corrected by an error correction circuit, adjusting a bit line connection signal that controls a connection between a bit line connected to one of the selected memory cells and a page buffer connected to the bit line to compensate for a reduction or an increase in a threshold voltage of the selected memory cell.

17. The method of claim 16, further comprising, after adjusting the bit line connection signal, repeating (a) and (b).

18. The method of claim 16, further comprising:
upon determining that the data does not contain at least one error that cannot be corrected by an error correction circuit, completing the read operation without repeating (a) and (b).

19. The method of claim 16, wherein the bit line connection signal is controlled to increase or decrease a difference between voltages of the bit line connection signal when the selected bit line is precharged and when the selected bit line is sensed, according to a control signal.

20. The method of claim 16, wherein the bit line connection signal is controlled to increase or decrease a developing time period of the bit line, according to a control signal.

* * * * *